United States Patent
Yuen et al.

(10) Patent No.: US 7,863,983 B2
(45) Date of Patent: Jan. 4, 2011

(54) SMART LINEARIZED POWER AMPLIFIER AND RELATED SYSTEMS AND METHODS

(75) Inventors: Cindy Yuen, Saratoga, CA (US); Kirk Laursen, Atlanta, GA (US); Duc Chu, San Jose, CA (US)

(73) Assignee: Epic Communications, Inc., Sunnyvale, CA (US)

( * ) Notice: Subject to any disclaimer, the term of this patent is extended or adjusted under 35 U.S.C. 154(b) by 395 days.

(21) Appl. No.: 11/664,749

(22) PCT Filed: May 19, 2004

(86) PCT No.: PCT/US2004/015856

§ 371 (c)(1),
(2), (4) Date: Nov. 7, 2008

(87) PCT Pub. No.: WO2004/105231

PCT Pub. Date: Dec. 2, 2004

(65) Prior Publication Data

US 2009/0174475 A1    Jul. 9, 2009

(51) Int. Cl.
*H03G 3/10* (2006.01)
(52) U.S. Cl. .................. 330/285; 330/311; 330/133; 330/310
(58) Field of Classification Search ............ 330/133, 330/310, 311
See application file for complete search history.

(56) References Cited

U.S. PATENT DOCUMENTS

| | | | |
|---|---|---|---|
| 5,404,585 A | 4/1995 | Vimpari et al. | |
| 5,432,473 A * | 7/1995 | Mattila et al. | 330/133 |
| 6,054,898 A * | 4/2000 | Okuma et al. | 330/266 |
| 6,172,567 B1 * | 1/2001 | Ueno et al. | 330/285 |
| 6,236,266 B1 * | 5/2001 | Choumei et al. | 330/133 |
| 6,492,869 B1 * | 12/2002 | Kuriyama | 330/133 |
| 6,518,843 B1 * | 2/2003 | Fujita | 330/284 |

FOREIGN PATENT DOCUMENTS

WO    PCT/US04/15856    5/2004

* cited by examiner

*Primary Examiner*—Patricia Nguyen
(74) *Attorney, Agent, or Firm*—Wilson Sonsini Goodrich & Rosati

(57) ABSTRACT

A power amplifier subsystem that includes a first stage amplifier and a second stage amplifier. A first bias circuit is coupled to the first stage amplifier, and the first bias circuit has a variable impedance that increases with radio frequency (RF) power. A second bias circuit is coupled to the second stage amplifier, and the second bias circuit has impedance relatively fixed with respect to radio frequency (RF) power. According to an embodiment of the invention, the first bias circuit comprises a transistor having a collector current that increases as radio frequency (RF) power increases. The second bias circuit can have a relatively fixed impedance. A method of designing an amplifier subsystem, where transistor size and resistor values are selected to obtain the desired bias and linearity characteristics, or transistor size and resistor values are selected to operate within a selected range, and amplifier performance is adjusted by changing the bias control voltage.

9 Claims, 21 Drawing Sheets

SMART LINEARIZED POWER AMPLIFIER AND RELATED SYSTEMS AND METHODS

BACKGROUND

A power amplifier is a key element in many electronic systems. For example, a power amplifier is one of the fundamental components of an electronic communication system, such as a wireless local area network (WLAN) or cellular phone system. The power amplifier and its operation can be a significant contribution to the cost and difficulty of design of the communication system. For example, excess use of power can impact the use of battery or other power source and contribute to difficulties in designing a communication system.

Problems in amplifier performance are gain compression and phase advance, due to the non-linearity of the amplifier. Designers have added biasing circuits to power amplifiers to improve performance over various conditions, yet these problems persist.

Many communication systems use two stage power amplifiers. FIG. 1 shows the typical fixed bias circuitry for a two-stage power amplifier using radio frequency (RF) chokes (inductors or resistors) and constant voltage supplies VB1, VB2. The RF impedances Z1, Z2 of these fixed bias circuits presented at the inputs of the first and second stage of the amplifier are constant when RF input power increases. The amplifier has gain compression and phase advance at high RF input power due to the non-linearity of the active devices under large RF drive. The gain compression is due to reduction of transistor transconductance (gm) at high RF input power. The phase advance is due to the base-collector capacitance variation at high RF input power. These gain compression and phase advance characteristics at high RF input power result in poor linearity performance of a power amplifier.

Because of the problems experienced with power amplifiers and their use, improved circuits and systems are needed.

SUMMARY

An embodiment of the invention is directed to a power amplifier subsystem that includes a first stage amplifier and a second stage amplifier. A first bias circuit is coupled to the first stage amplifier, and the first bias circuit has a variable impedance that increases with radio frequency (RF) power. A second bias circuit is coupled to the second stage amplifier, and the second bias circuit has impedance relatively fixed with respect to radio frequency (RF) power. According to an embodiment of the invention, the first bias circuit comprises a transistor having a collector current that increases as radio frequency (RF) power increases. The second bias circuit can have a relatively fixed impedance.

An embodiment of the invention is directed to a power amplifier subsystem having a first stage amplifier and a second stage amplifier, the first and second stage amplifiers each having an input, and a first bias circuit coupled to the input of the first stage amplifier. The first bias circuit has a first and a second transistor, wherein collector current of the first transistor increases and transconductance decreases as power input to the first stage amplifier increases. The power amplifier subsystem also includes a second bias circuit coupled to the second stage amplifier.

Another embodiment of the invention is directed to a method of designing an amplifier subsystem. Transistor size and resistor values are selected to obtain the desired bias and linearity characteristics. Alternatively, transistor size and resistor values are selected to operate within a selected range, and amplifier performance is adjusted by changing the bias control voltage.

According to another embodiment of the invention, a power amplifier subsystem includes a bias circuit coupled to the input of the first stage amplifier, and the bias circuit includes a first and second transistor. Each transistor has an emitter and collector. A plurality of resistors is also included. The emitter of the second transistor is coupled to a resistor to ground, the base of the second transistor and the emitter of the first transistor are coupled together and coupled to a resistor to ground and to the input of the first stage amplifier through a resistor.

Additionally, the collector of the first transistor may be coupled to a bias control voltage, or the collector of the first transistor may be coupled to a fixed voltage supply. The bias circuit may have a bias control voltage coupled to the collector of the second transistor and the base of the first transistor. The bias control voltage may be coupled to the collector of the second transistor and the base of the first transistor through a resistor.

The first transistor may comprise a silicon bipolar junction transistor (BJT), a gallium arsenide (GaAs) heterojuunction bipolar transistor (HBT), or a silicon germanium (SiGe) heterojunction bipolar transistor (HBT).

Another embodiment of the invention is directed to a single monolithic power amplifier subsystem. Included is a substrate, and, in a single monolithic microwave integrated circuit (MMIC) chip, a first stage amplifier and a second stage amplifier, the first and second stage amplifiers each having an input;

a first bias circuit coupled to the input of the first stage amplifier, the first bias circuit including:

a first transistor having an emitter and collector, a second transistor having an emitter and collector, and a plurality of resistors, and wherein the emitter of the second transistor is coupled to a resistor to ground, the base of the second transistor and the emitter of the first transistor are coupled together and coupled to a resistor to ground, and to the input of the first stage amplifier through a resistor; and a second bias circuit coupled to the second stage amplifier.

DETAILED DESCRIPTION

An embodiment of the invention is directed to a linearized power amplifier, which can help to provide linear gain and high efficiency with high output power. Embodiments of the invention may be directed to a linearized power amplifier in a communication system such as a wireless local area network (WLAN), 802.11, dual band, tri-mode, cellular phones, Bluetooth, broadband, cable modems, satellites, and other applications.

Gallium Arsenide (GaAs) heterojunction bipolar transistor (HBT), silicon germanium (SiGe) HBTs and/or other non-linear device technology can be utilized to realize embodiments of the invention, for example as a single chip monolithic microwave integrated circuit (MMIC).

An embodiment of the invention provides bias circuitry coupled with a power amplifier. The circuitry helps to provide optimized bias to the power amplifier when RF input power increases. The biasing helps to improve gain and/or phase performance with respect to input power. According to an embodiment of the invention, the linearized power amplifier is adjustable, for example where the user can make the adjustment, or where the system automatically makes the adjustment.

According to one implementation, dynamic bias circuitry is coupled to an amplifier, and the bias circuitry is realized using two transistors and a few resistors. The dynamic bias circuitry can provide optimized impedance to the power amplifier with the transistors in the bias circuitry, as a function of input radio frequency (RF) power. The dynamic bias circuitry helps to improve overall gain and phase performance with respect to input power hence improving the linearity of the power amplifier. According to an embodiment of the invention, the transistors are heterojunction bipolar transistors (HBTs).

Figure 1:
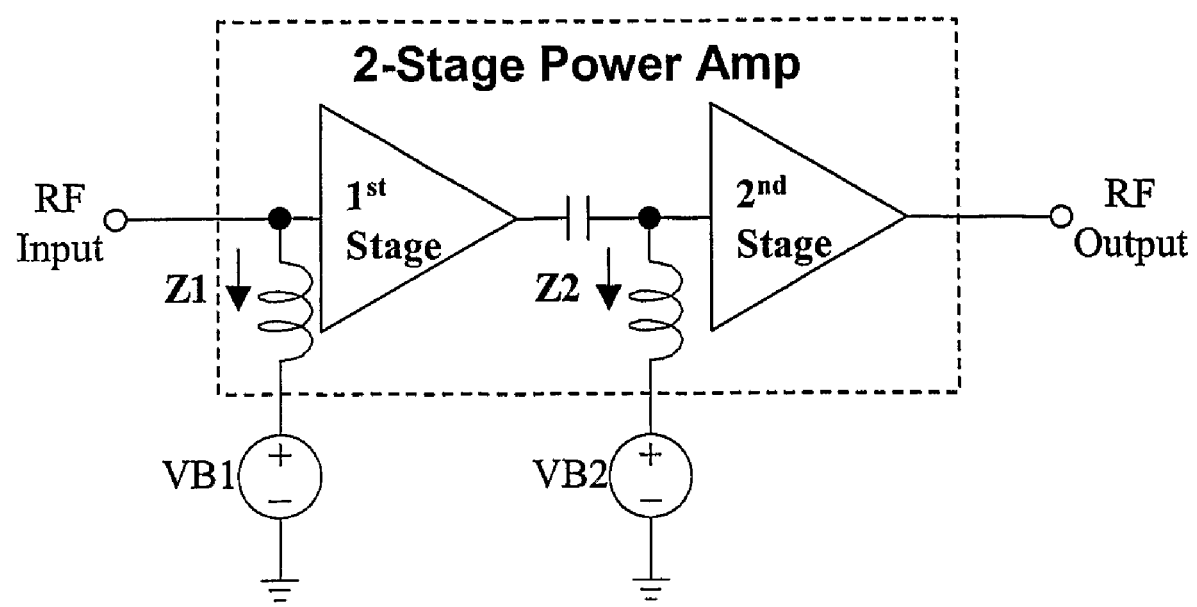
FIG. 1 shows the typical fixed bias circuitry for a two-stage power amplifier using radio frequency (RF) chokes and constant voltage supplies.
Figure 2:
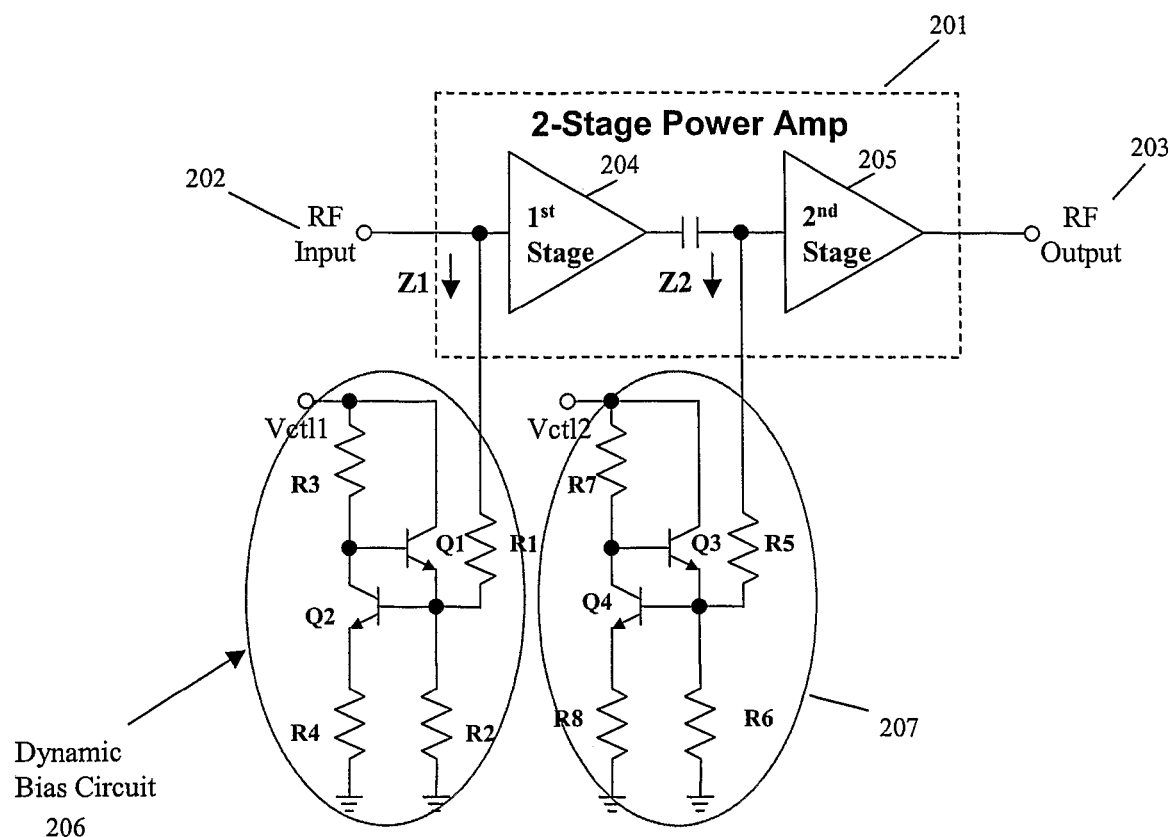
FIG. 2 shows a two-stage power amplifier with dynamic bias circuitry, according to an embodiment of the invention.

FIG. 2 shows a two-stage power amplifier with dynamic bias circuitry, according to an embodiment of the invention. Included are first stage amplifier 204, second stage amplifier 205, first bias circuit 206 and second bias circuit 207. The bias circuit typically includes two NPN transistors and four resistors. The first bias circuit 206 includes first transistor Q1, second transistor Q2, and resistors R1, R2, R3 and R4.

First bias circuit 206 is coupled to the input of first stage amplifier 204. The input of the first stage amplifier is connected to the base of second transistor Q2 and the emitter of first transistor Q1 through a small resistor R1. This node is also connected to resistor R2 to ground. The collector of first transistor Q1 is connected to the bias control voltage Vctl1. The collector of second transistor Q2 is connected to the base of first transistor Q1 and to the bias control voltage through resistor R3. The emitter of second transistor Q2 is connected to resistor R4 to ground.

Second bias circuit 207 is coupled to the input of the second stage amplifier. This bias circuit also typically includes two NPN transistors and four resistors. Second bias circuit 207 includes third transistor Q3, fourth transistor Q4 and resistors R5, R6, R7 and R8. The input of the second stage amplifier is connected to the base of fourth transistor Q4 and the emitter of third transistor Q3 through a small resistor R5. This node is also connected to resistor R6 to ground. The collector of third transistor Q3 is connected to the bias control voltage Vctl2. The collector of fourth transistor Q4 is connected to the base of third transistor Q3 and to the bias control voltage through resistor R7. The emitter of fourth transistor Q4 is connected to resistor R8 to ground.

The bias circuit uses two transistors and resistors to present a variable impedance to the amplifier input. The variable impedance of the bias circuit is designed to increase with RF power and compensate for the power dependency that would occur in the first amplifier stage if a fixed impedance bias circuit were used. As the RF input power increases, the collector current of first transistor Q1 increases and the transconductance (gm) decreases, resulting in an increased impedance level presented to the first stage of the amplifier. This effectively creates a gain expansion effect to compensate for the gain compression that would normally occur if a fixed bias were used, resulting in better overall linearity.

By adjusting the bias control voltage, the bias level applied to the amplifier stage can be adjusted. For a given bias control voltage, the quiescent bias level to the first stage can be set by adjusting the sizes of the two transistors and the resistor values.

The bias circuit may be designed to operate from a fixed bias control voltage by adjusting the transistor sizes and resistor values to achieve the desired bias and linearity characteristics. Alternatively, the bias circuit elements may be designed to operate (in concert with the amplifier stage) at some nominal condition, and the amplifier performance (gain, linearity, etc.) may be adjusted by changing the bias control voltage within a certain range. The specifics of the bias circuit design will depend on the operating characteristics of the amplifier and the desired linearity performance. The same type of bias circuit may be utilized for multiple amplifier stages with different specific characteristics for each stage. For instance, the overall linearity improvement of a multi-stage amplifier may be accomplished by using a bias circuit with large impedance variation for the first stage, while later stages use smaller impedance variations.

The dynamic bias circuitry shown in FIG. 2 is realized using small heterojunction bipolar transistors (HBTs)(e.g., transistors Q1, Q2 may comprise HBTs) and a few resistors (e.g., resistors R1, R2, R3, R4), according to an embodiment of the invention. This novel dynamic bias circuitry can provide dynamic impedances Z1 and Z2 at the inputs to the first and second stage power amplifiers as a function of input RF power, as shown in FIG. 3(b). When RF input power increases, the impedance Z1 of the bias circuitry increases hence reducing the RF signal entering into the bias circuitry and resulting in higher power amplifier gain at high RF input power.

These dynamic bias circuitries combined with a two stage power amplifier will help to improve the overall flatness of gain and phase performance with respect to RF input power, hence improving the linearity performance relative to a conventional power amplifier.

The HBT Q1 (or Q3) and resistor R1 (or R5) in the dynamic bias circuitry are the two key elements that generate the optimized dynamic impedances Z1 and Z2 for power amplifier bias, which results in power amplifier linearization. The other elements such as HBT Q2, R2, R3, R4 (or Q4, R6, R7, R8) in the dynamic bias circuitry can be selected to provide the intended biases for the HBTs in the power amplifier.

The linearity performance of the power amplifier can be optimized by choosing the proper HBT Q1 (or Q3) size and R1 (R5) value and then by properly selecting the bias voltages Vctrl1, Vctrl2 of the dynamic bias circuitries.

The elements in the circuitry may have various values. According to various embodiments of the invention, all or a subset of elements respective have values in the following ranges:

Q1 and/or Q3: 2 μm×10 μm–2 μm×20 μm
Q2 and/or Q4: 2 μm×μm 10–2 μm×20 μm
R1: 15-30 ohms
R2: 2K-4K ohms
R3: 0-600 ohms
R4: 150-400 ohms
R5: 15-30 ohms
R6: 1K-4K ohms
R7: 0-600 ohms
R8: 350-750 ohms Other values of these elements are possible, according to other embodiments.

Figure 3A:
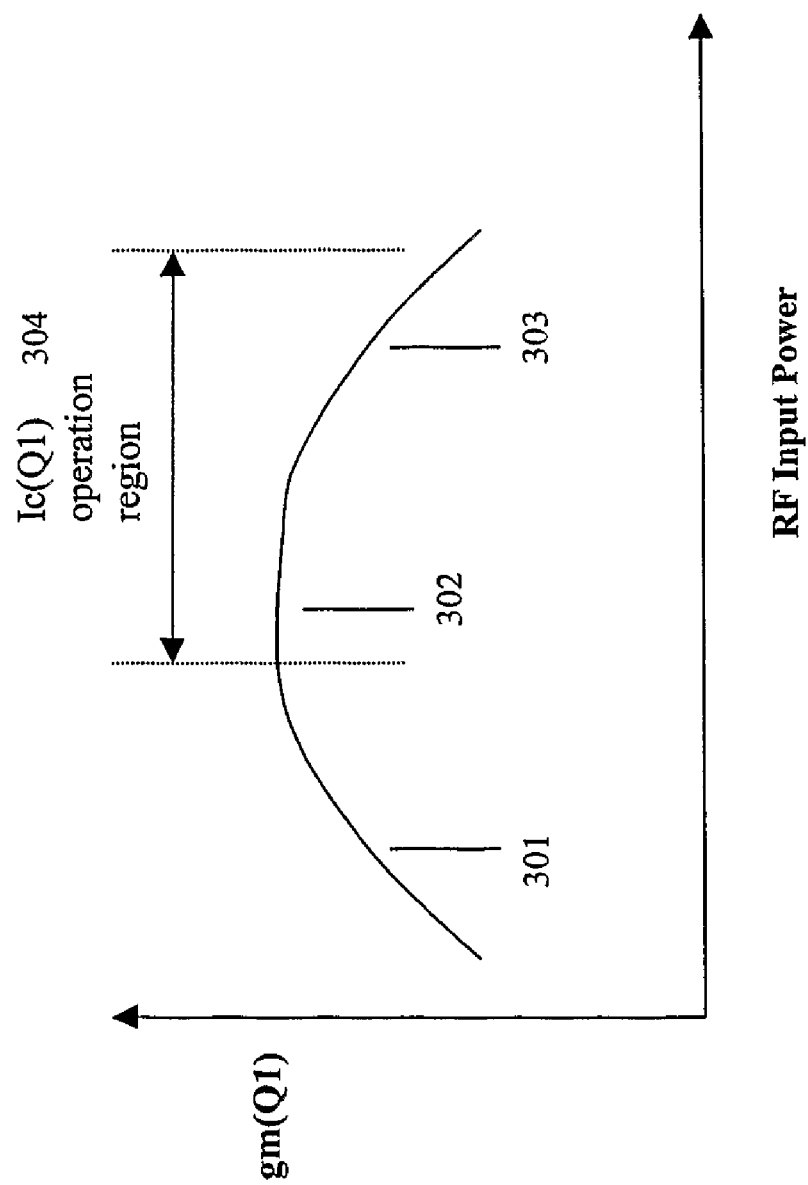
FIG. 3(a) shows transconductance (gm) of transistor Q1 versus RF input power, according to an embodiment of the invention.
Figure 3B:
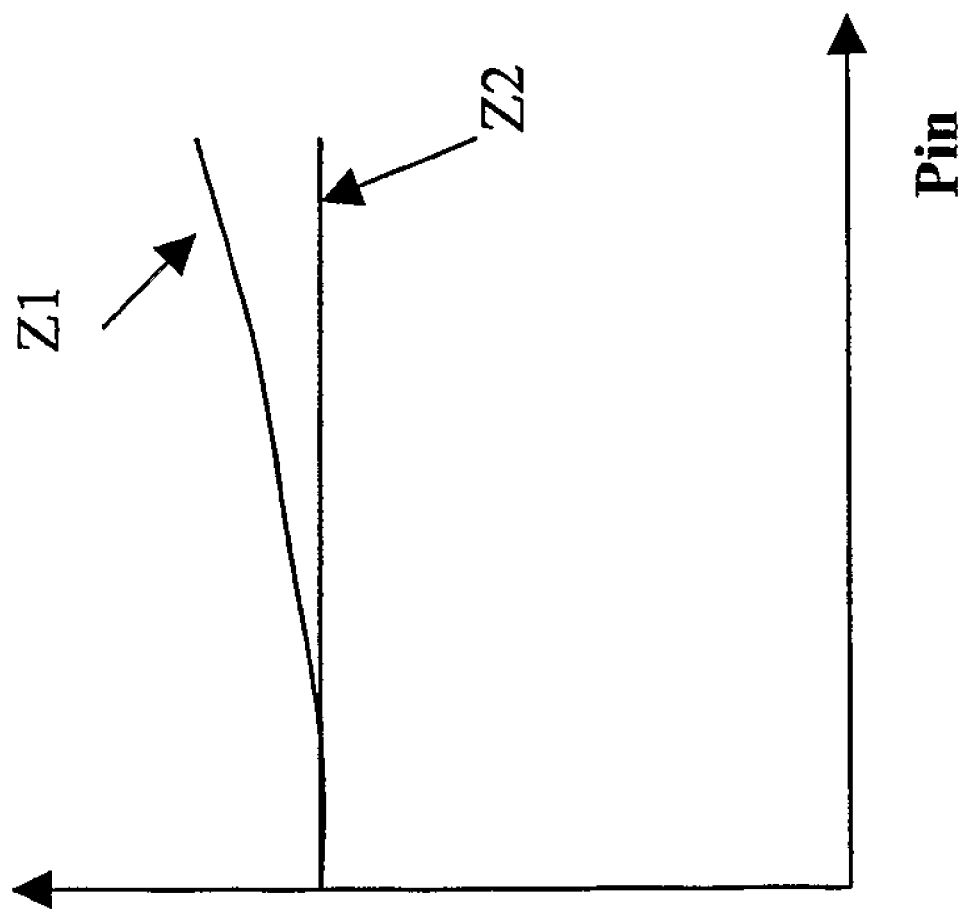
FIG. 3(b) shows RF impedances Z1 and Z2 of the dynamic bias circuits versus RF input power, according to an embodiment of the invention.

FIG. 3(a) shows transconductance (gm) of transistor Q1 versus RF input power, according to an embodiment of the invention. As shown, transconductance increases with RF input power in the lower region 301, then remains flat in the middle region 302, then decreases in upper region 303. Operating region 304 starts in middle region 302 where transconductance is relatively flat and continues through part of region 303, where transconductance decreases with RF input power. As collector current Ic(Q1) of the first transistor increases, transconductance gm(Q1) of the first transistor eventually decreases and impedance Z1 of the bias circuit increases. As the input power to the amplifier increases, collector and base currents respectively, Ic1, Ib1 of first stage HBT (the first stage amplifier), increase. Collector current of Q1 Ic(Q1) increases, transconductance gm(Q1) decreases, hence impedance Z1 of the bias circuit increases. This will reduce the RF signal entering to the dynamic bias circuit and hence help to reduce the gain compression at high RF input power.

FIG. 3(b) shows RF impedances Z1 and Z2 of dynamic bias circuits versus RF input power. As shown, impedance Z1 of the first stage bias circuit increases in the upper region of input power, while impedance Z2 of the second stage bias circuit remains relatively constant. The impedance Z1 (Z1~R1+1/gm(Q1), and approximately Z1~1/gm(Q1)) of the first stage dynamic bias circuitry is selected to increase with input power, and this helps to create gain expansion in the first stage amplifier. Impedance Z1 is dominated by 1/gm(Q1), by selecting resistor R1 to be much smaller in value than the impedance, 1/gm(Q1), of transistor Q1. The impedance Z2 of the second stage bias circuitry is selected to be constant versus input power, which results in gain compression of the second stage amplifier when RF input power increases. Z2~R5+1/gm(Q3)~R5 which is constant as input power Pin increases. R5 is chosen to dominate Z2.

By combining the two amplifier stages together, the gain expansion from the first stage amplifier helps to compensate for the gain compression of the second stage amplifier and result in an overall flat gain versus input power performance across wide RF input power range.

Figure 4:
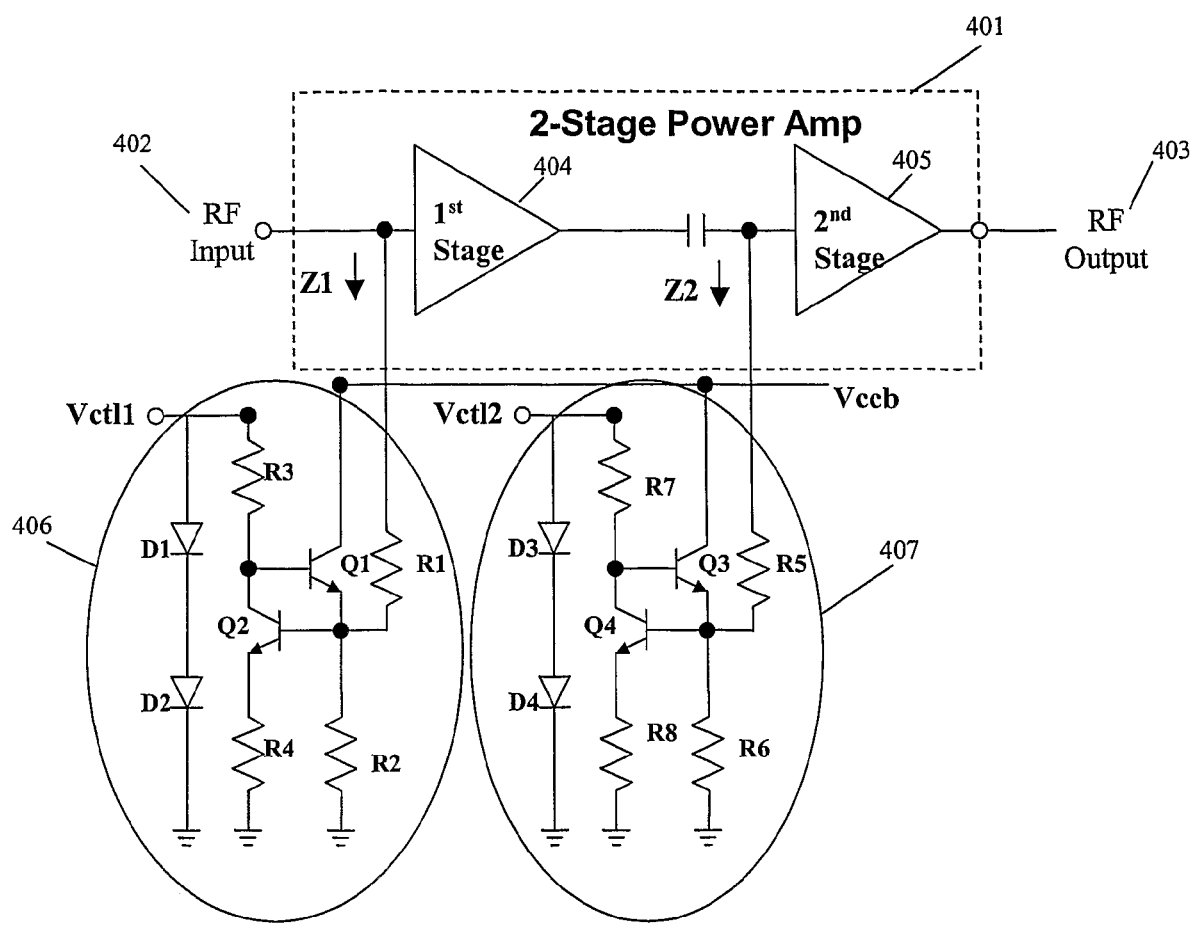
FIG. 4 shows an alternative two-stage power amplifier with dynamic bias circuitry, according to an embodiment of the invention.

FIG. 4 shows an alternative two stage amplifier with dynamic bias circuitry, according to an embodiment of the invention. Included are first stage amplifier 404, second stage amplifier 405, first bias circuit 406 and second bias circuit 407. Bias circuit 406 includes diodes D1 and D2, in addition to the other circuitry shown. Second bias circuit 407 includes diodes D3 and D4, in addition to the other circuitry shown. According to an embodiment of the invention, the circuit is used in wireless local area network (WLAN) applications to help provide improved performance.

Here, bias control voltage Vctl1 is coupled to ground through diodes D1 and D2, and bias control voltage Vctl2 is coupled to ground through diodes D3 and D4. Bias control current Ictl1 and bias control current Ictl2 are reduced at high input power by separating the bias supplies of HBT transistors Q1 and Q3 (using separate Vccb supply) and HBT transistors Q2 and Q4 HBT (using Vctl1 and Vctl2). This can be helpful because control voltage supplies Vctl1 and Vctl2 can handle only less than 5 mA of current in typical systems. The sensitivity of the linearized power amplifier is reduced with respect to control voltage Vctl variations by adding two level shift diodes D1, D2 and D3, D4 in the bias circuits.

Figure 5:
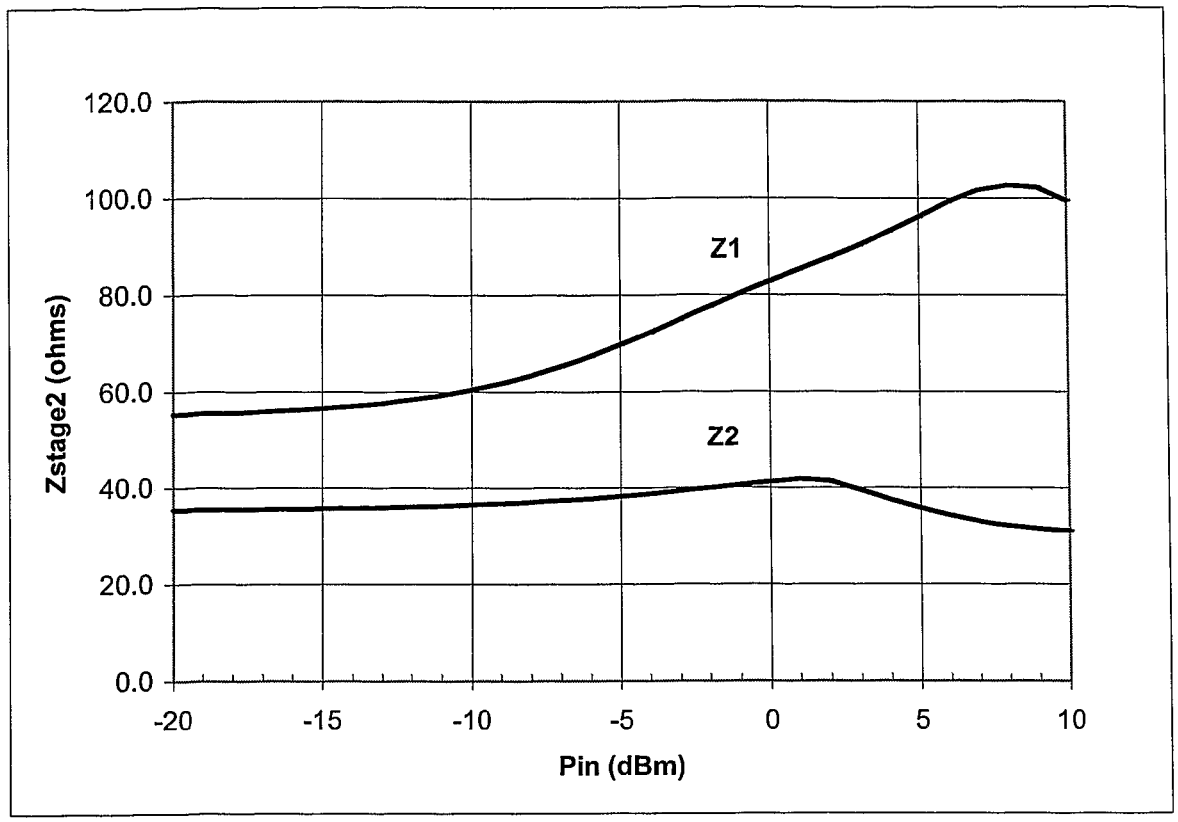
FIG. 5 shows simulated RF impedances Z1 and Z2 of first and second stage dynamic bias circuitries versus RF input power in a linearized power amplifier using non-linear HBT models, according to an embodiment of the invention.

FIG. 5 shows simulated RF impedances Z1 and Z2 of first and second stage dynamic bias circuitries versus RF input power in a linearized power amplifier using non-linear HBT models, according to an embodiment of the invention. First stage bias impedance Z1 increases when input power increases, and second stage bias impedance Z2 remains relatively constant when RF input power increases. Actual values may differ from those shown in this and the other charts depending on a number of factors. The values shown are only approximate.

Figure 6:
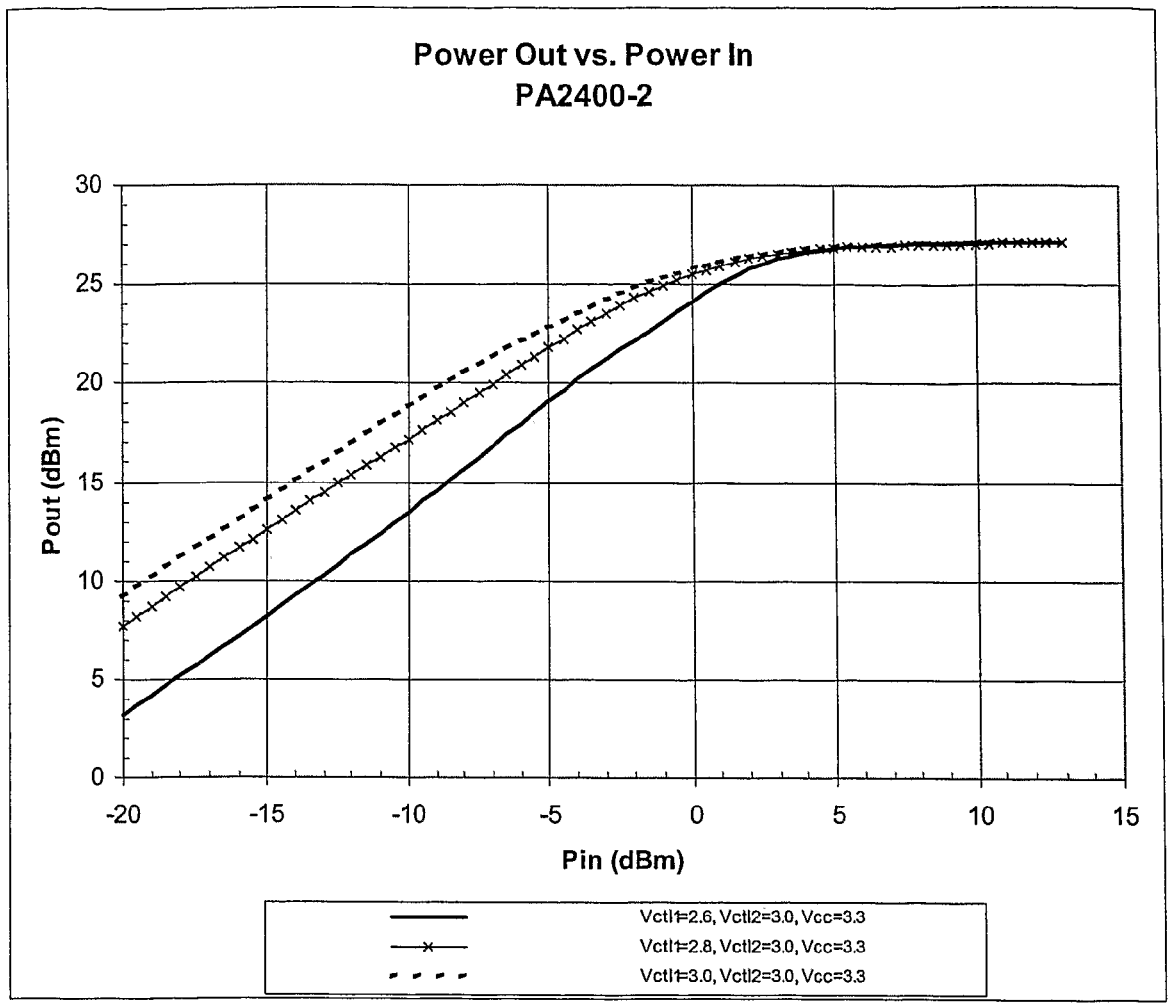
FIG. 6 shows output power versus input power with adjustment of the voltage supply to the dynamic biasing circuitry of a linearized power amplifier, according to an embodiment of the invention.

FIG. 6 shows output power versus input power curve with adjustment of the voltage supply to the dynamic biasing circuitry of a linearized power amplifier, according to an embodiment of the invention. Particularly good linearity is achieved at Vctl1=2.6V, Vctl2=3.0V (Solid line curve) when the gain input power is flattest up to power amplifier saturation (Pin=+5 dBm).

Figure 7:
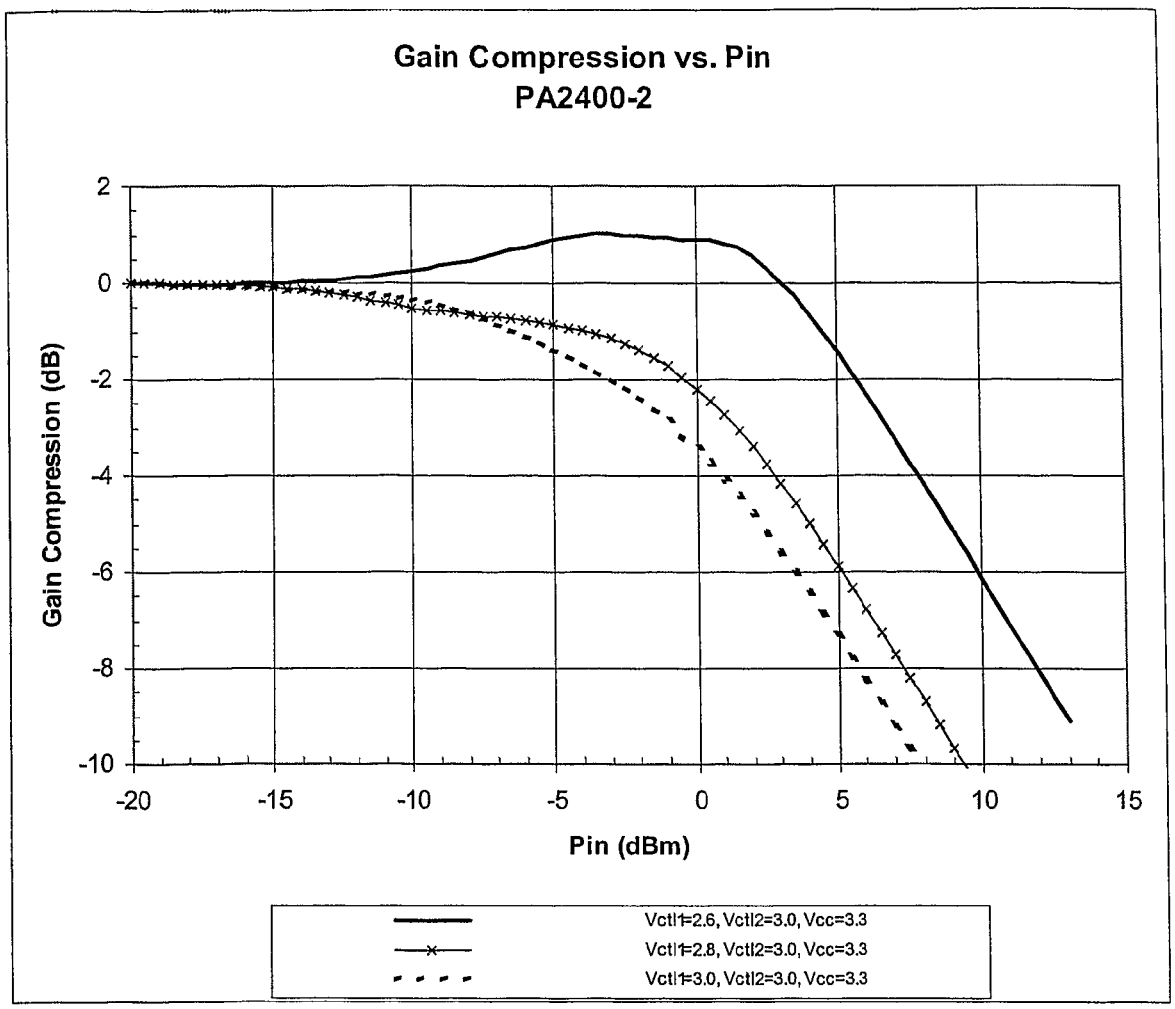
FIG. 7 shows the changes in gain compression versus RF input power by adjusting the voltage supply to dynamic biasing circuitry of a linearized power amplifier, according to an embodiment of the invention.

FIG. 7 shows gain compression versus RF input power by adjusting the voltage supply to dynamic biasing circuitry of linearized power amplifier, according to an embodiment of the invention. Particularly good linearized power amplifier linearity is achieved at Vctl1=2.6V, Vctl2=3.0V (Solid line curve) when the gain versus input power is flattest up to power amplifier saturation (Pin=+5 dBm).

Figure 8:
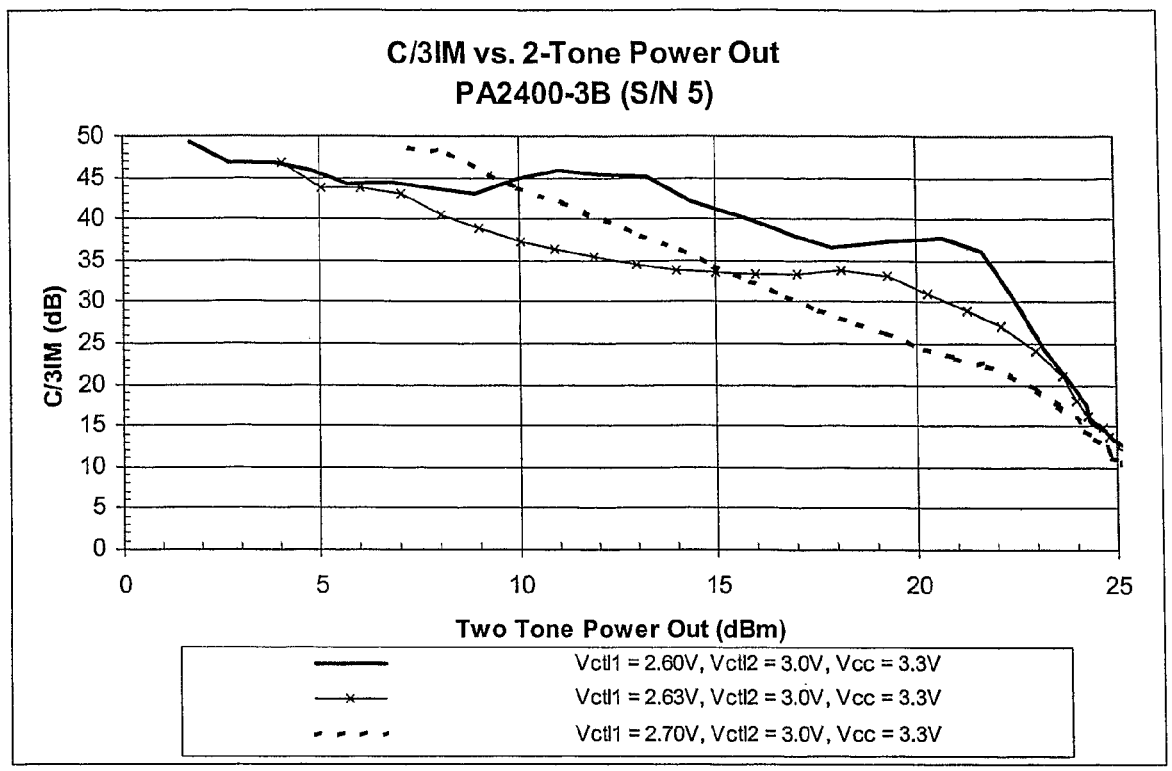
FIG. 8 shows two-tone third-order inter-modulation (IM3) of a linearized power amplifier with dynamic bias circuitry set at various operating conditions, according to an embodiment of the invention.

FIG. 8 shows two-tone third-order inter-modulation (IM3) of a linearized power amplifier with dynamic bias circuitry set at various operation conditions, according to an embodiment of the invention. Particularly good IM3 performance of the power amplifier occurs at Vctl1=2.6V, Vctl2=3.0V (Solid line curve).

The adjustability of the linearized power amplifier refers to its capability of optimizing linearized power amplifier performance (output power, linearity, efficiency tradeoffs) at a specific output power level (or output power range) and at specific operation mode and data rate. This adjustability of the linearized power amplifier can be realized by automatically optimizing the bias condition of the linearized power amplifier based on the detected signal from the on-chip power sensor or by taking an external command, for example from a MAC that can provide operation mode or data rate information or user input to the linearized power amplifier. This adjustability can be used in the communication system to realize a smart linearized power amplifier, which offers optimized performance at selected operational output power level (or range) and operation mode and data rate.

Figure 9A:
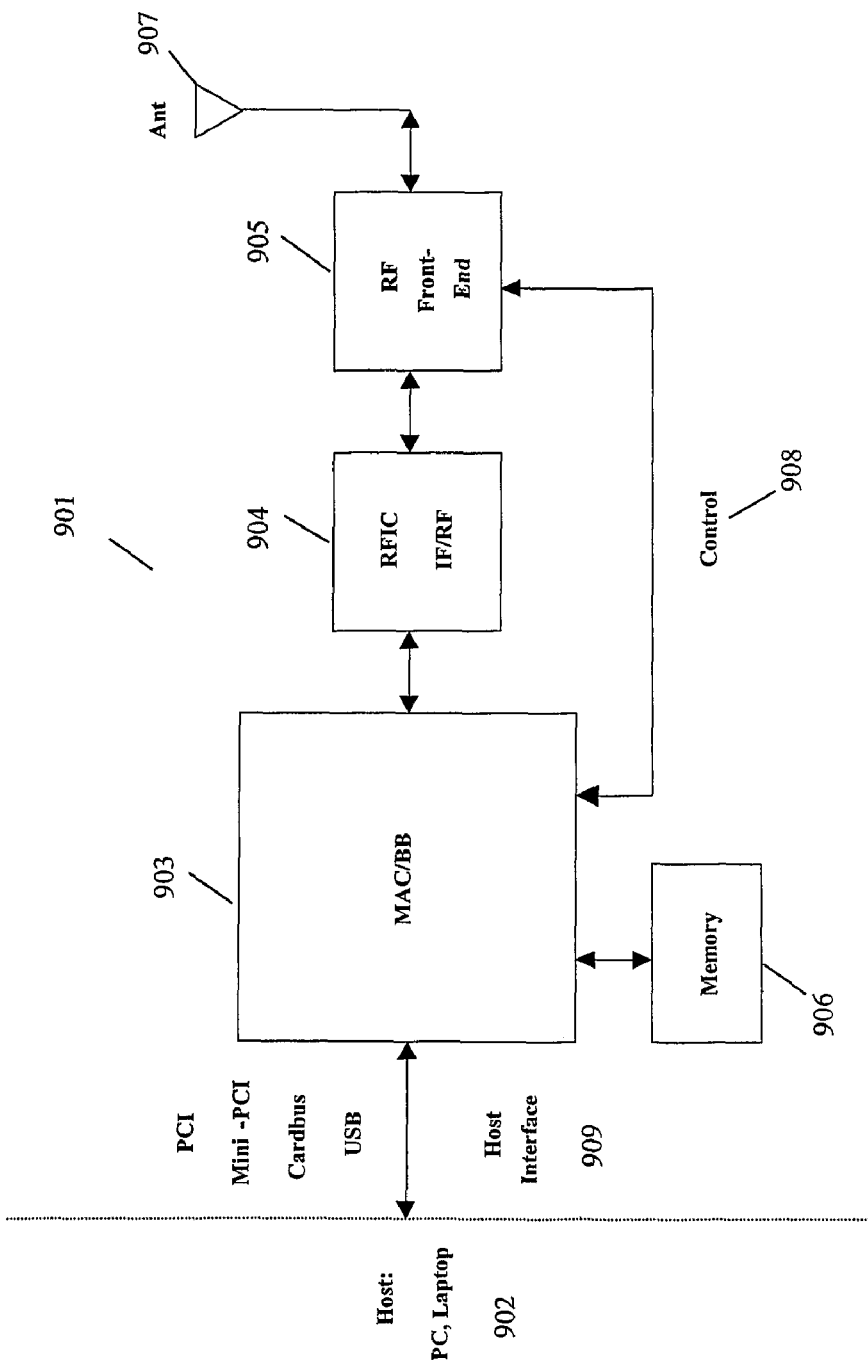
FIG. 9(a) shows an adjustable linearized power amplifier in a computer system with communication capability, according to an embodiment of the invention.

FIG. 9(a) shows an adjustable linearized power amplifier in a computer system with communication capabilities, according to an embodiment of the invention. The computer system includes a host 902, such as a PC or laptop, or other computer or automated system, and a wireless local area network (WLAN) transceiver system 901. RF front-end 905 includes a linearized power amplifier with bias circuitry, according to the description herein.

Host 902 communicates wirelessly with other systems with the use of WLAN transceiver system 901. WLAN transceiver system 901 includes a host interface 909, a baseband media access control circuit (MAC/BB) 903, radio frequency circuit (RFIC IF/RF) 904, RF front-end 905, antenna 907 and memory 906. Various interfaces between the WLAN transceiver (MAC) and host PC (or laptop) such as PCI, mini-PCI, cardbus or USB, and others are provided, according to various embodiments of the invention. Digital information passes from host to 902 to MAC/BB 903, and is converted to analog radio frequency signal in RFIC 904. The analog signal then passes from RFIC 904 to RF front-end 905 for amplification and transmission via antenna 907. Control 908 from MAC/BB 903 allows MAC/BB 903 to control the characteristics of the amplifier and bias circuitry contained in RF front-end 905, in accordance with the description herein. Control 908 is bidirectional.

Host 902 sends data to transceiver 901 using the host interface 909. Host interface 909 may be any desired format, including but not limited to PCI, Mini-PCI, Cardbus, USB, etc. Host interface 909 transfers the data to MAC/BB 903 which processes, modulates and converts it before sending it to RFIC 904. RFIC 904 upconverts the processed and modulated data from baseband to an RF frequency. This conversion may be a direct conversion from baseband to RF, or it may involve the use of one or more intermediate frequencies (IF), depending on other system performance and cost requirements. This RF signal is sent to the RF front-end 905 where it is filtered (to reduce spurious signal levels generated by the RFIC), amplified using a linearized power amp, and filtered again to reduce any undesirable harmonics that may exist. RF front-end 905 includes a power detector at its output, whose signal is sent to MAC/BB 903 for interpretation. MAC 903 takes the output power level information and compares it to the information contained in a lookup table in memory 906. MAC 903 uses the results of the comparison to control and adjust the linearity and output power level of the linearized power amplifier inside RF front-end 905. The RF output signal of the RF Front-end is also directed to antenna 907 for transmission.

Embodiments of the invention include various devices with communication capabilities (including both hardwired and wireless devices) that contain an adjustable linearized power amplifier. Embodiments of the invention include cellular phones, Bluetooth devices, broadband, cable modems, satellites, digital cameras, PDAs, PocketPCs, Smartphones, ultra-thin notebooks, printers, scanners and other devices and systems. A WLAN embedded cellular phone embodiment of the invention, for example, includes an adjustable linearized power amplifier inside a compact WLAN tranceiver as described herein, along with other elements of a telephone, such as a housing, microphone, speaker, display, keypad, antenna, tuner, power source, baseband processor, RF transceiver, RF Front End, memory, and FM radio or other combination or subset of these elements. The WLAN embedded cellular phone also includes a standard WLAN SDIO (serial digital input output) interface, according to an embodiment of the invention. Another embodiment of the invention is directed to a digital camera with communication capabilities, such as an embodiment with WLAN transceiver capabilities. The camera includes a lens, image sensor and WLAN transceiver with a linearized power amplifier. The compact WLAN transceiver inside the camera also may include a standard SDIO interface. Another embodiment is directed to a hand-sized personal digital assistant (PDA) having a processor, memory, WLAN transceiver with linearized power amplifier. The PDA may also have a standard WLAN SDIO interface. The standard WLAN SDIO interface in these devices may be in accordance with the description herein.

Figure 9B:
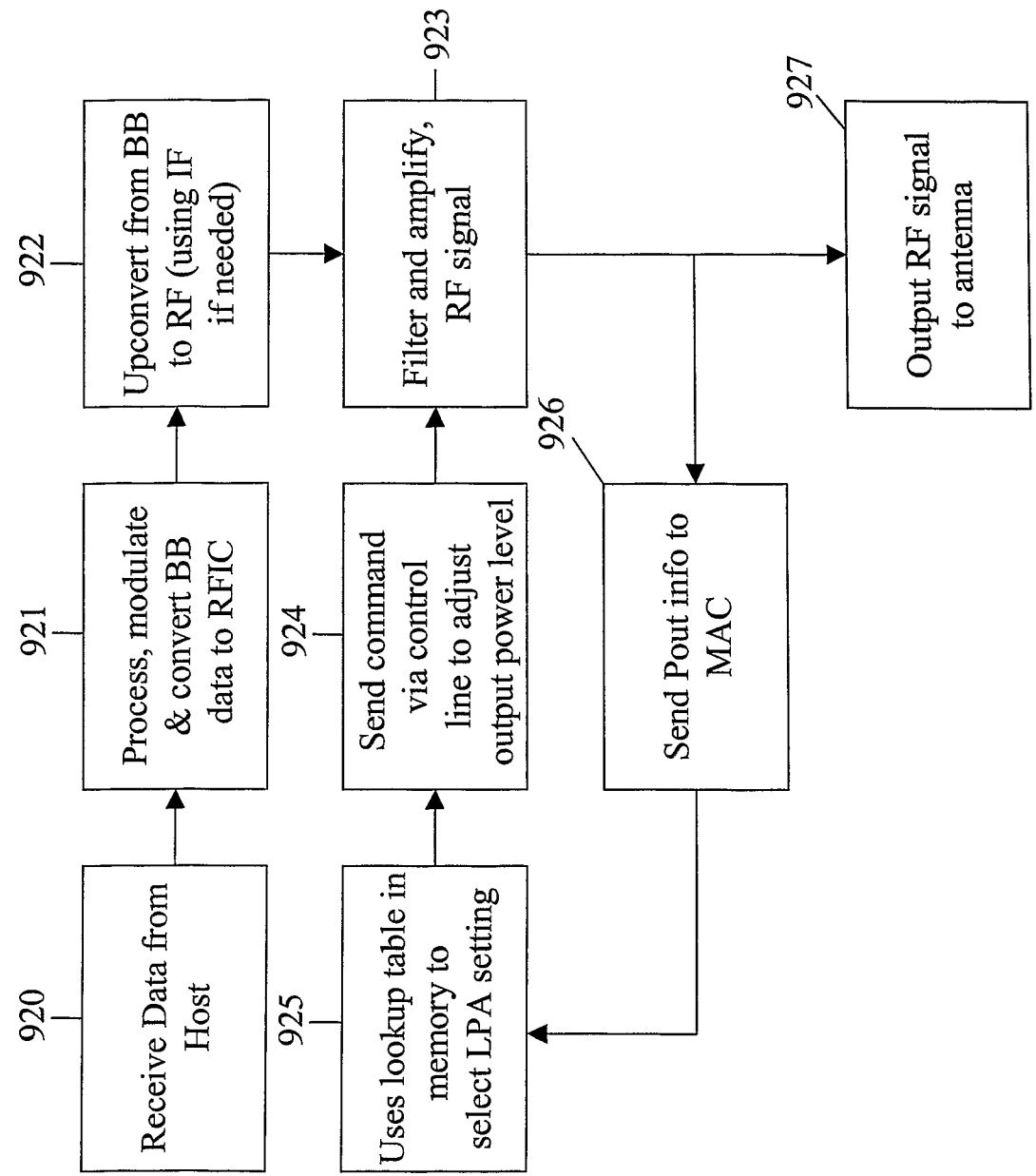
FIG. 9(b) shows a flow diagram of a computer system using an adjustable linearized power amplifier, according to an embodiment of the invention.

FIG. 9(b) shows a flow diagram of a system, such as a computer system, using an adjustable linearized power amplifier, according to an embodiment of the invention. Parts of the flow may be implemented in software, such as software contained within or controlling the MAC, while other parts are implemented in hardware. First, data is received from a host (block 920). Digital data is processed, modulated and converted to baseband frequency (block 921). Baseband signal is then upconverted to RF (block 922). The upconverted RF signal is sent to the RF front-end. The RF signal is filtered, (to reduce spurious signal levels generated by the RFIC), amplified using a linearized power amp (LPA), and filtered again to reduce any undesirable harmonics that may exist (block 923). The RF front-end (905) includes a power detector at its output. The power detector sends the information about the output power level to the MAC (block 926).

The output power level information is compared to the information contained in a lookup table in memory (block 925). The MAC uses the results of the comparison to control and adjust the linearity and output power level of the linearized power amplifier inside the RF front-end (block 924). The RF output signal of the RF Front-end is also directed to an antenna for transmission (block 927).

Figure 10A:
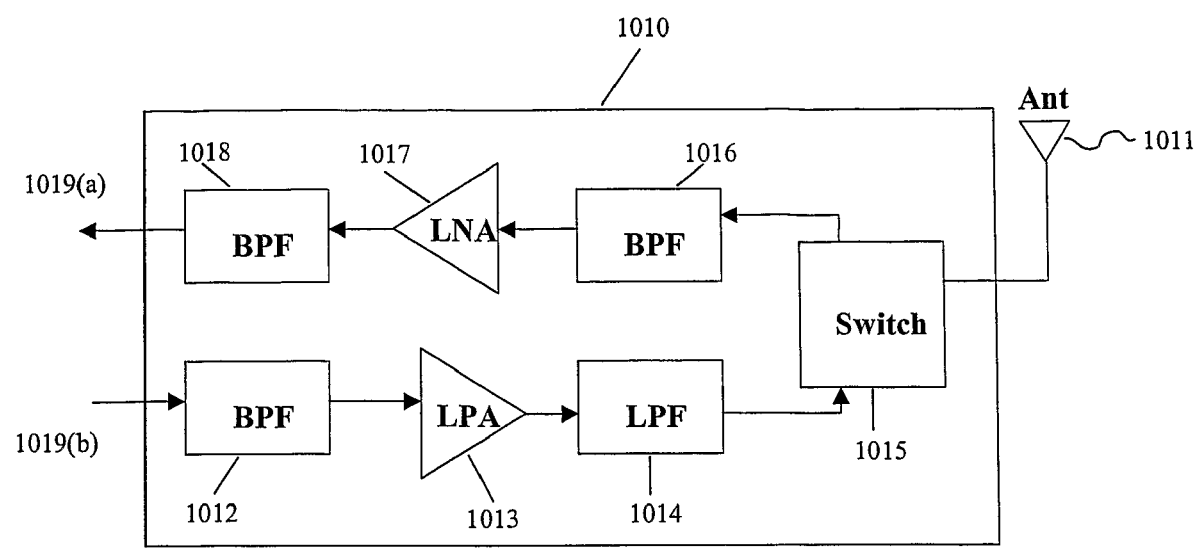
FIG. 10(a) shows an RF front-end module, according to an embodiment of the invention.

FIG. 10(a) shows an RF front-end module, according to an embodiment of the invention. The RF front end module 1010 is used as a front end of a WLAN transceiver, according to an embodiment of the invention. RF front-end module 1010 includes receive chain 1019(a) and transmit chain 1019(b). Receive chain 1019(a) includes a high power TR (or DPDT) switch 1015, a bandpass filter 1016, a low noise amplifier 1017 and band pass filter 1018. Transmit chain 1019(b)

includes band pass filter 1012, power amplifier 1013 and low pass filter 1014, and TR switch 1015. Power amplifier 1013 in transmit chain 1019(*b*) helps to provide high output power (to transmit long distance), high linearity (to have high data fidelity) and high efficiency (to have long battery life).

Figure 10B:
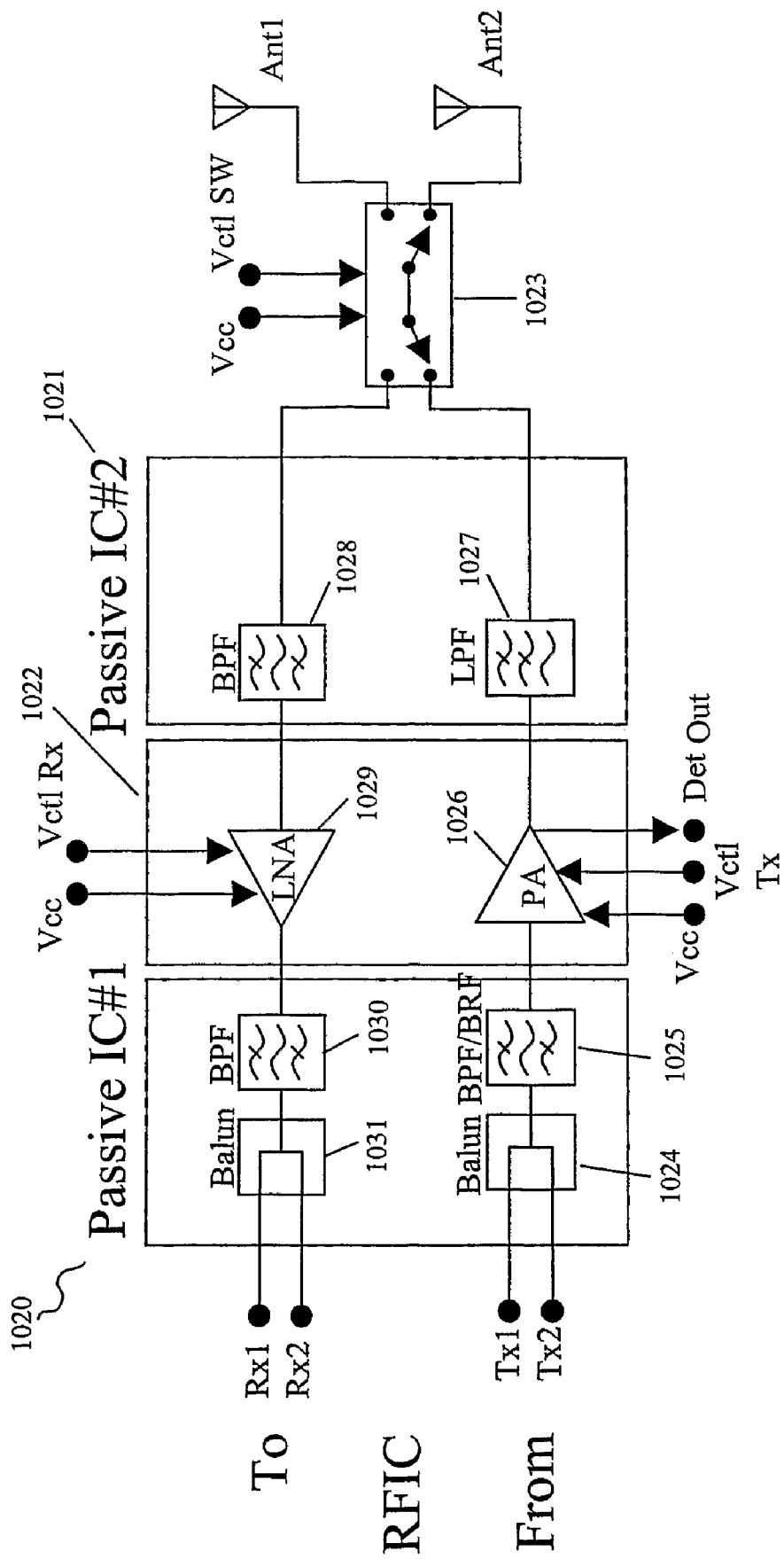
FIG. 10(b) shows an RF front-end module for a WLAN single band (IEEE 802.11b/g, 2.4 GHz only) transceiver, according to an embodiment of the invention.
Figure 10C:
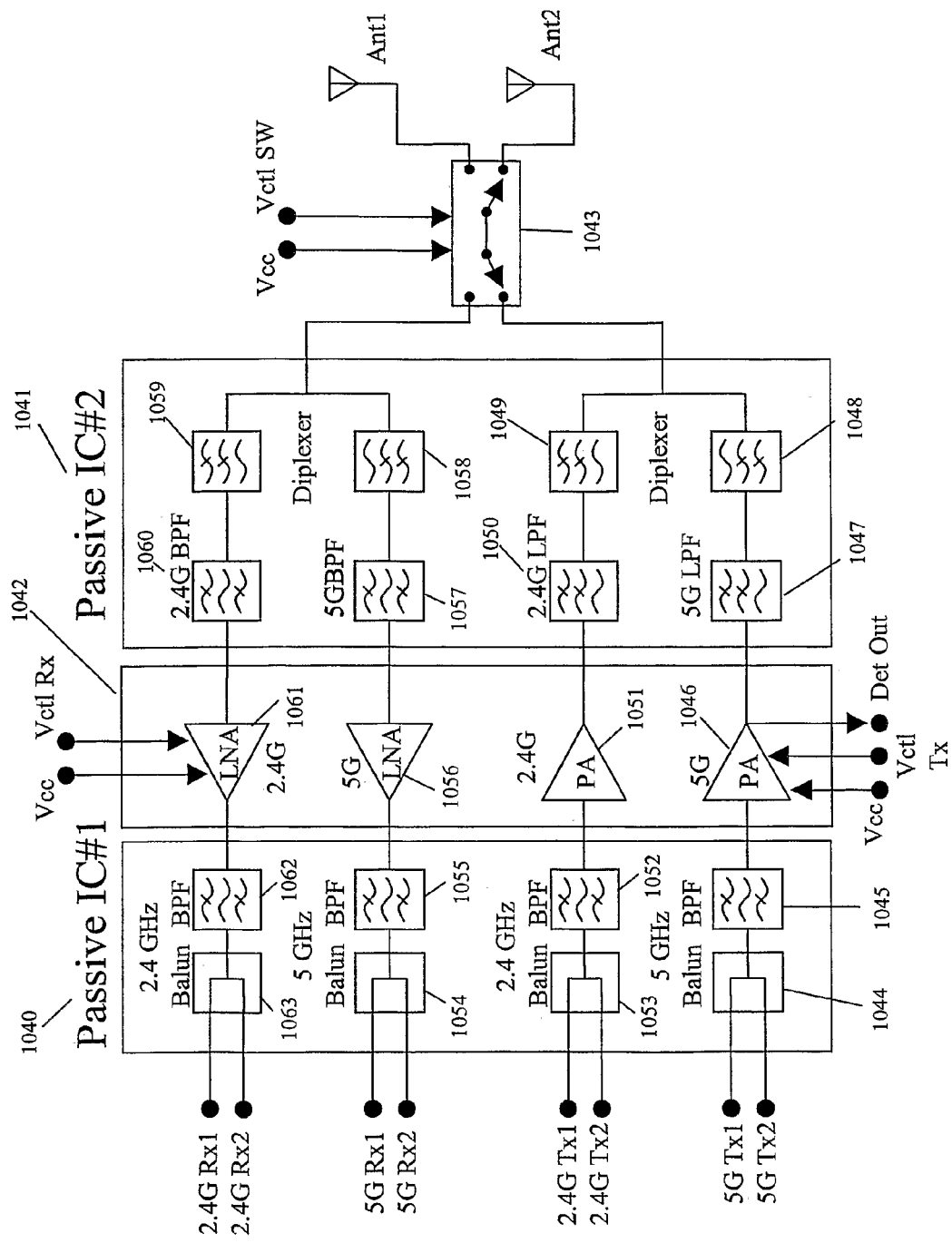
FIG. 10(c) shows an RF front-end module for a dual band (IEEE 802.11a/b/g, 2.4 GHz and 5 GHz) transceiver, according to an embodiment of the invention.

FIGS. 10(*b*) and 10(*c*) show more detailed block diagrams of RF front-end modules. FIG. 10(*b*) shows an RF front-end module for a wireless local area network (WLAN) single band (802.11b/g, 2.4 GHz only) transceiver, according to an embodiment of the invention. Between the radio frequency integrated circuit (RFIC) and the antennas, the WLAN transceiver includes a passive IC (Passive IC #1) 1020 containing filters and baluns, an active IC 1022 that contains an LNA 1029 for the receive chain and a power amplifier 1026 for the transmit chain, a passive IC (Passive IC #2) 1021 containing filters, and a switch 1023 for selecting the transmit or receive path and antenna 1 or antenna 2.

Passive IC #1 1020 includes two baluns 1031 and 1024 (one (1031) for the receive path and one (1024) for the transmit path) that are used to convert between the differential signals used by the radio frequency integrated circuit (RFIC) and the single ended signals used by the other elements. These act as the interface between the RFIC and other circuitry described below. Passive IC#1 1020 also includes two bandpass filters 1030 and 1025 (one for each path) to filter out unwanted signals and noise outside of the 2.4 GHz band.

Amplifier chip 1022 includes a 2.4 GHz low noise amplifier 1029 and a 2.4 GHz power amplifier 1026 for the receive path and the transmit paths respectively. Low noise amplifier 1029 has a Vcc connection to attach to the main power, and control voltage connection (Vctl_Rx) that may be used to adjust the gain or turn the low noise amplifier 1029 on and off. Power amplifier 1026 also has a Vcc connection for main power, a control voltage (Vctl_Tx) for adjusting the gain, linearity, etc., and a peak detector output connection to indicate signal strength.

Passive IC #2 1021 contains more filters—a band pass filter (BPF) 1028 for the receive path to minimize out-of-band signals, and a low pass filter (LPF) 1027 for the transmit path to minimize harmonics, etc.

Switch 1023 is used to connect the appropriate antenna to the appropriate function (transmit or receive). Switch 1023 is shown as a dual pole, dual throw switch (DPDT), with a Vcc connection for main power, and a control voltage (Vctl_SW) for controlling the function (transmit or receive) path selection. Note, however, that there are other types of switches that could be used, and in some cases the Vcc connection may not be required.

FIG. 10(*c*) shows an RF front end module for a dual band (802.11 a/b/g, 2.4 GHz and 5 GHz) wireless local area network (WLAN) transceiver, according to an embodiment of the invention. Between the RFIC and the antennas the WLAN transceiver includes a passive IC (Passive IC #1) 1040 including filters 1062, 1055, 1052, and 1045 and baluns 1063, 1054, 1053, and 1044, an active IC 1042 that includes four amplifiers (two low noise amplifiers (LNAs) 1061 and 1056 for the receive chain and two power amplifiers 1051 and 1046 for the transmit chain), a passive IC (Passive IC #2) 1041 including filters and diplexers, and a switch 1043 for selecting the transmit or receive path. The integrated circuits provide four functions or paths: 2.4 GHz receive, 2.4 GHz transmit, 5 GHz receive, and 5 GHz transmit.

Passive IC #1 1040 contains four baluns (two (1063 and 1054) for the receive paths and two (1053 and 1044) for the transmit paths) that are used to convert between the differential signals used by the radio frequency integrated circuit (RFIC) and the single ended signals used by the other elements. Passive IC#1 1040 also includes four band-pass filters (1062, 1055, 1052, and 1045)(one for each path) to filter out unwanted signals and noise and to minimize interference outside of the appropriate band.

Amplifier chip 1042 includes a 2.4 GHz low noise amplifier (LNA) 1061, a 5 GHz low noise amplifier (LNA) 1056, a 2.4 GHz power amplifier (PA) 1051, and a 5 GHz power amplifier (PA) 1046. The low noise amplifiers have a Vcc connection to attach to the main power, and control voltage connection (Vctl_Rx) that may be used to adjust the gain or turn the low noise amplifiers on and off. The power amplifiers also have a Vcc connection for main power, a control voltage (Vctl_Tx) for adjusting the gain, linearity, etc., and a peak detector output connection to indicate signal strength.

Passive IC #2 1041 includes more filters—band pass filters (BPFs) 1060 and 1057 for the receive paths to minimize out-of-band signals, and low pass filters (LPFs) or band pass filters (BPFs) 1050 and 1047 for the transmit paths to minimize harmonics, interference, etc. Passive IC #2 1041 also includes a receive diplexer (consisting of 1058 and 1059), and a transmit diplexer (consisting of 1048 and 1049).

Switch 1043 is used to connect the appropriate antenna to the appropriate function (transmit or receive). The switch is shown as a dual pole dual throw (DPDT), with a Vcc connection for main power, and a control voltage (Vctl_SW) for controlling the function (transmit or receive) path selection. Note however that there are other types of switches that could be used, and in some cases the Vcc connection may not be required.

A diplexer in the receive chain comprises two filters 1058 and 1059 operating at different frequencies (e.g. 2.4 GHz and 5 GHz) and has one RF input and two RF outputs. The diplexer splits a broadband input signal into two parts (based on frequency) and directs them different ways. In this configuration, when a broadband RF signal enters the diplexer, only the low frequency portion of the broadband signal will pass through the low pass filter (LPF) 1059 and be directed to the 2.4 GHz band pass filter (BPF) 1060. The high frequency portion of the broadband signal will pass through high pass filter (HPF) 1058 and be directed to the 5 GHz band pass filter (BPF) 1057.

A diplexer in the transmit chain consists of two filters 1048 and 1049 operating at different frequencies (e.g. 2.4 GHz and 5 GHz) and has two RF inputs and one RF output. It operates in a complementary manner to the receive diplexer described above, by combining two input signals (at different frequencies) into a single broadband signal. In this configuration the diplexer (consisting of the low pass filter 1049 and high pass filter 1048), takes the signal received from the 2.4 GHz low pass filter 1050 and combines it with the signal received from the 5 GHz low pass filter 1047 to generate a single broadband RF signal that is sent on for transmission.

Parameters that can help lead to high performance for a linearized power amplifier are:

(1) High output power: The signal will transmit long distance with high linearized power amplifier Pout. This can be realized by carefully designing the linearized power amplifier with optimized matching and biasing circuits.

(2) High linearity: The transmit signal will have high data fidelity (or accuracy) at high data rate (or complex modulation). This can be realized by novel linearization circuit design using either dynamic bias circuit or pre-distortion type circuit.

(3) High efficiency (or low power consumption): This will extend the battery life and minimizing thermal issue which will improve reliability.

It is difficult to achieve all three key parameters for a linearized power amplifier. Usually there will be tradeoffs between the three performance parameters.

Figure 11A:
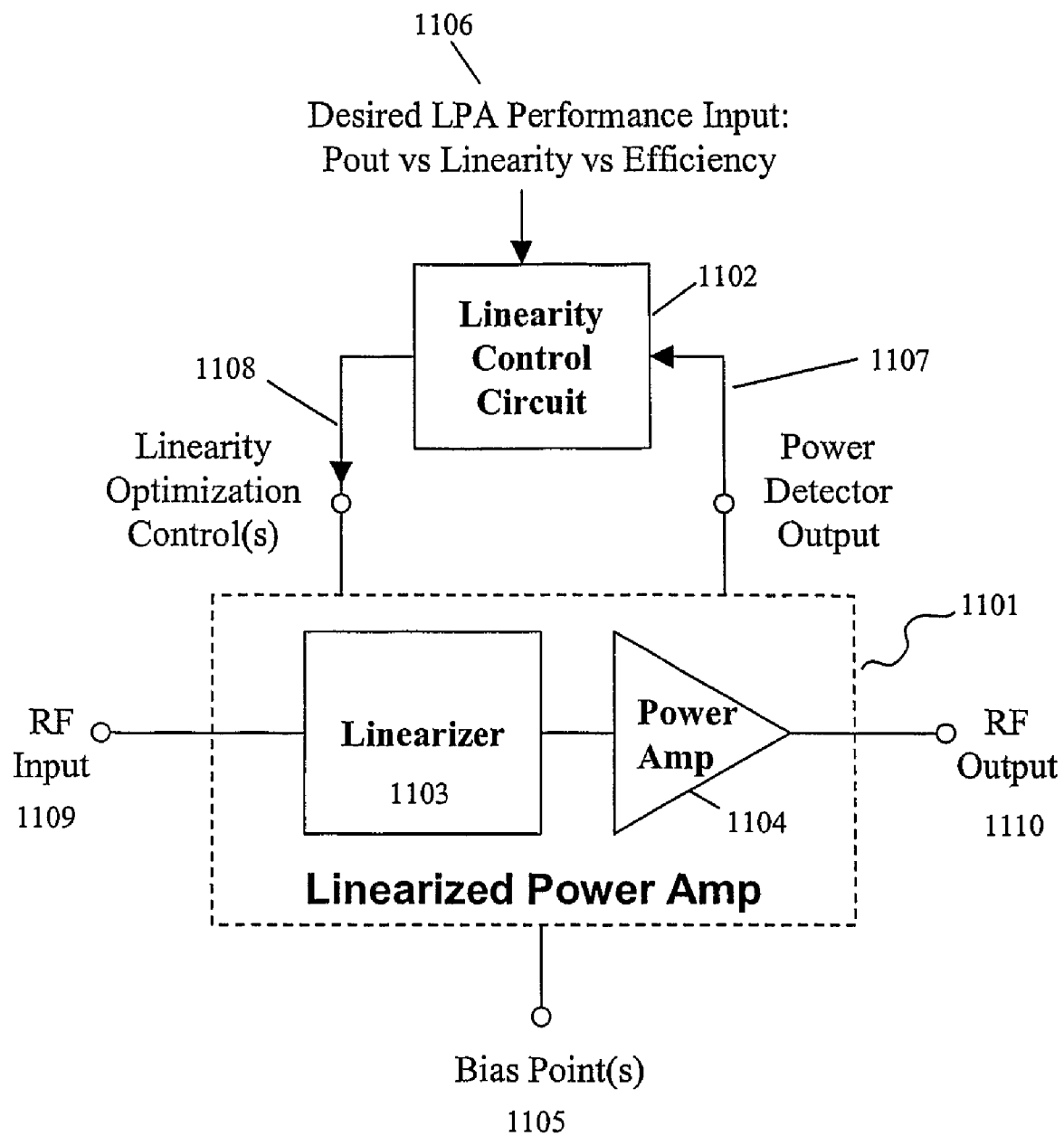
FIG. 11(a) shows a linearized power amplifier with a linearity control circuit block to adjust linearized power amplifier control biases, according to an embodiment of the invention.

FIG. 11(a) shows a linearized power amplifier with a linearity control circuit block to adjust linearized power amplifier control biases to tradeoff the performance between high output power, high linearity and high efficiency, according to an embodiment of the invention. Included is linearized power amplifier 1101, linearity control circuit 1102, desired linear power amplifier performance input 1106, and bias point 1105. Also included are RF input 1109 and RF output 1110. Linearized power amplifier 1101 includes linearizer 1103 and power amplifier 1104. Linearity control circuit 1102 provides linearity optimization controls 1108 and receives power detector output 1107. Thus, a desired performance input may be provided to linearity control circuit 1102. This performance input is made based on a selection between power output, linearity and efficiency. Linearity control circuit 1102, based on such input, provides linearity optimization controls 1108 to linearized power amplifier 1101. These linearity optimization controls 1108 are based on power output 1110 detected from linearized power amplifier 1101.

The following is a description of operation of linearized power amplifier 1101. RF input signal 1109 enters linearized power amplifier 1101. Bias points 1105 supply DC power to the linearized power amplifier 1101. The RF signal is linearized and amplified before reaching RF output 1110. A power detector is incorporated into power amplifier 1104, and the output of this detector 1107 is sent to a linearity control circuit 1102. Linearity control circuit 1102 has as its inputs the present linearized power amplifier output power level 1107 provided by the power detector and a desired linearized power amplifier performance level 1106, which is defined externally. This desired linearized power amplifier performance 1106 selects a particular balance of the linearized power amplifier 1101 output power level, linearity, and efficiency. Linearity control circuit 1102 uses these inputs to determine the optimal linearity settings that are then fed back to the linearized power amplifier 1101 using linearity optimization controls 1108.

Figure 11B:
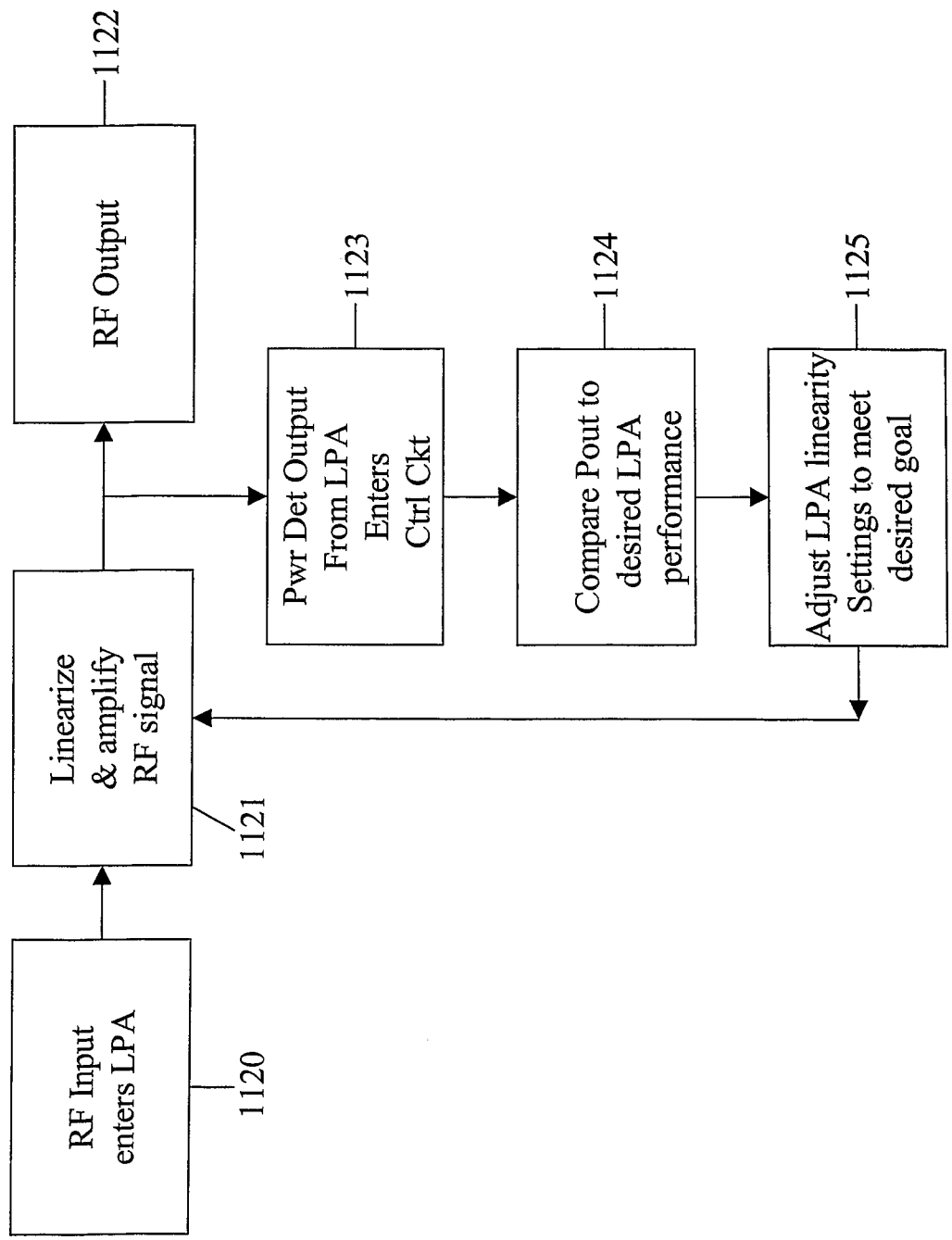
FIG. 11(b) shows a flow diagram of use and adjustment of a linearized power amplifier, according to an embodiment of the invention.

FIG. 11(b) shows a flow diagram of use and adjustment of a linearized power amplifier, according to an embodiment of the invention. Parts of the flow may be implemented in software, such as software contained within or controlling the control circuit, while other parts are implemented in hardware. The RF input signal enters the linearized power amplifier (block 1120). The linearized power amplifier linearizes the RF signal using a linearizer and amplifies it using a power amplifier (block 1121). The linearized and amplified RF signal is directed to the RF output (block 1122). A power detector that is present at the output of the linearized power amplifier sends RF output power level information to the control circuit (block 1123). The linearity control circuit compares the measured linearized power amplifier output power level provided by the power detector to the desired linearized power amplifier performance level (block 1124), which is defined externally. The externally defined performance level may come directly from a user, or it may be defined by a MAC or other computer controller based on the desired transmit range, data rate, or other environmental variables. The control circuit then adjusts the linearized power amplifier linearity settings (block 1125) to meet the desired performance goal, and sends the settings to the linearized power amplifier using the linearized power amplifier control lines.

Figure 12:
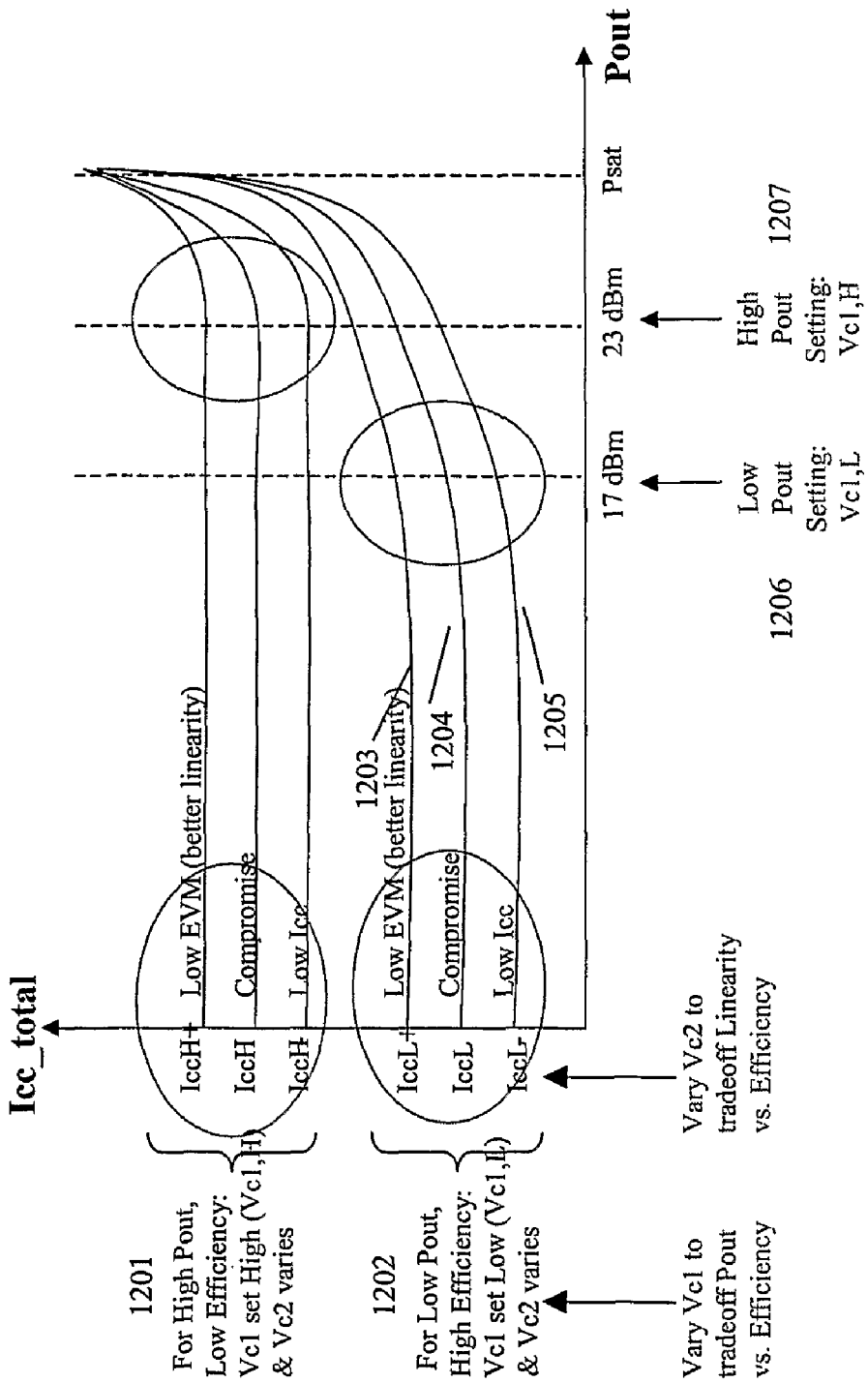
FIG. 12 shows the current consumption Icc versus output power for a linearized power amplifier, according to an embodiment of the invention.

FIG. 12 shows the current consumption Icc versus output power for a linearized power amplifier, according to an embodiment of the invention. Two control biases (Vc1 and Vc2) are available for this linearized power amplifier. Control voltage Vc1 can be set at either a low level (Vc1,L) corresponding to Icc current in the vicinity of IccL, or Vc1 can be set at a high level (Vc1,H) corresponding to Icc current in the vicinity of IccH. Thus, if control voltage Vc1 is set to a higher value, then a higher output power is achieved, at a lower efficiency (traces 1201). If control voltage Vc1 is set to a lower value, then a lower output power is achieved, at a higher efficiency (traces 1202). Control voltage Vc2 can be selected among low, medium and high current consumption to tradeoff between high linearity (low error vector magnitude (EVM)) and high efficiency (low Icc). If Vc1 is set high, Vc2 may be set high to achieve high Pout and low EVM with Icc=IccH+ (best linearity at high output power), or Vc2 may be set low to achieve high Pout and better efficiency with Icc=IccH−(best efficiency at high output power). If Vc1 is set low, Vc2 may be set low to achieve low Pout and low Icc with Icc=IccL−(best efficiency at low output power), or Vc2 may be set high to achieve low Pout and low EVM with Icc=IccL+(best linearity at low output power). Thus, low EVM (better linearity) is achieved with a higher current consumption Icc and a higher EVM (poorer linearity) is achieved with a lower Icc.

The adjustability of the linearized power amplifier can be realized by one or both types of at least two control circuits, according to an embodiment of the invention. The first control circuit takes control from an on-chip peak detector, which senses the output power level, and then adjusts the power amplifier biases for optimized power amplifier performance at this operating power level. The second control circuit takes input from outside, such as from MAC command or as defined by the user, according to various embodiments, and then adjusts the power amplifier bias point for high efficiency and/or high linearity according to the operation mode or data rate, or user requirement.

Figure 13A:
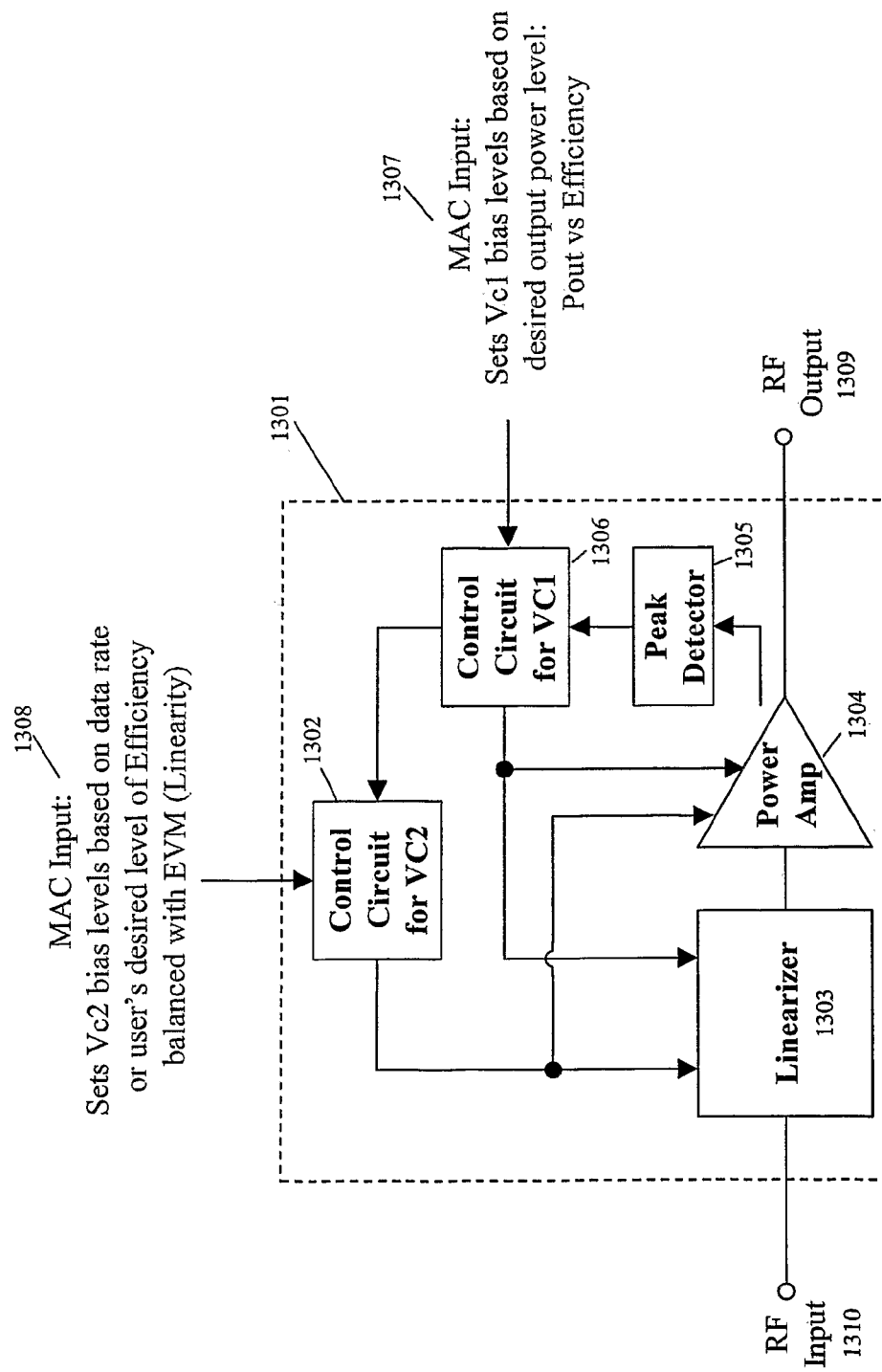
FIG. 13(a) shows a block diagram of a smart linearized power amplifier that includes two control circuits, according to an embodiment of the invention.

FIG. 13(a) shows a block diagram of a smart linearized power amplifier which includes two control circuits, according to an embodiment of the invention. Shown are a smart linearized power amplifier 1301 with MAC input 1308, MAC input 1307, RF input 1310 and RF output 1309. Smart linearized power amplifier 1301 includes linearizer 1303, power amplifier 1304, peak detector 1305, control circuit for Vc1 1306 and control circuit for Vc2 1302.

RF input 1310 is coupled into the input of linearizer 1303, the output of which is connected to power amplifier 1304. The output of power amplifier 1304 is coupled to RF output 1309 and to the input of peak detector 1305. The output of peak detector 1305 is coupled into control circuit for Vc1 1306. The output of control circuit for Vc1 1306 is coupled to control circuit for Vc2 1302 and linearizer 1303 and power amplifier 1304. The output from control circuit for Vc2 1302 is coupled to the input of linearizer 1303 and power amplifier 1304. MAC input 1308 is coupled into control circuit for Vc2 1302. MAC input 1307 is coupled to an input for control circuit for Vc1 1306.

Control circuit for Vc1 1306 takes input from on-chip peak detector 1305 which senses the output power level of power amplifier 1304 and then adjusts the linearized power amplifier bias (Vc1) to optimize the efficiency according to the required output power level. For high output power, Vc1 is set high. For low output power, Vc1 is set low. MAC input 1307 sets Vc1 bias levels based on desired output level, considering power output versus efficiency. Control circuit for Vc2 1302 takes external input from the MAC (or user) which provides information on operation mode or data rate, then adjusts the LPA bias (Vc2) to optimize linearity and/or efficiency (low error vector magnitude (EVM), compromised EVM & Icc or low Icc cases).

RF input signal 1310 enters the linearized power amplifier 1301. In this configuration, a two stage linearized power amplifier is shown, although the concept could be applied to an amplifier consisting of any number of stages. The RF signal is linearized and amplified before reaching RF output 1309. A peak detector 1305 is incorporated into the linearized power amplifier 1301 to determine the RF output power level, and the output of this detector is used as an input for stage 1 control circuit 1306 and the stage 2 control circuit 1302. Stage 1 control circuit 1306 uses input from the MAC 1307 with data from the peak detector 1305 to set the first stage bias levels of linearizer 1303 and power amplifier 1304 to meet the desired overall output linearity, power level, and efficiency. Similarly, stage 2 control circuit 1302 uses input from MAC 1308 with data from peak detector 1305 to set the second stage bias levels of the linearizer 1303 and power amplifier 1304 to meet the linearity, power level, and efficiency requirements. The MAC inputs (1307 and 1308) may be controlled by a user directly or determined from a lookup table accessible by the MAC. Depending on the requirements, only one of the stages of linearized power amplifier 1301 (combination of 1303 and 1304) may need to be adjusted to meet the requirements, or both may need to be adjusted together.

As the data rate of a communication signal increases, the linearity requirements on the amplifiers used to transmit the signals also become tighter. For a slow signal, the amplifier can transmit at a high output power level (close to saturation) with relatively poor linearity, while still maintaining the integrity of the signal. For a high data rate signal, a more linear amplifier is required, which typically means operating at a lower power level (backing off the amplifier from saturation) with improved linearity. To make the system as efficient as possible (or to achieve the maximum range possible), it is desirable to know the data rate and to bias the amplifier such that it has the highest possible power output while still meeting the linearity requirements.

Figure 13B:
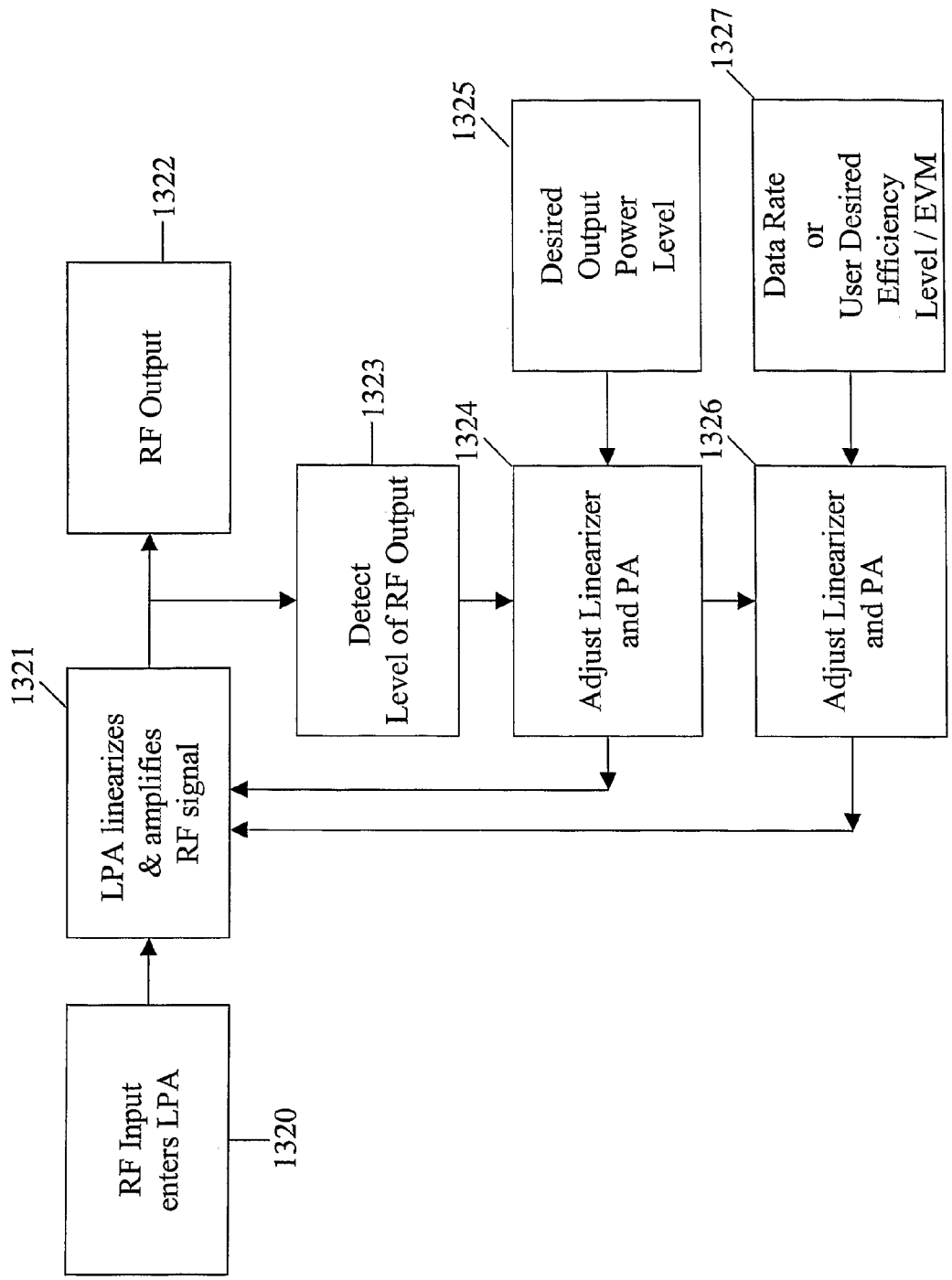
FIG. 13(b) shows a flow diagram of use and adjustment of a smart linearized power amplifier, according to an embodiment of the invention.

FIG. 13(*b*) shows a flow diagram of use and adjustment of a linearized power amplifier, according to an embodiment of the invention. Parts of the flow may be implemented in software, such as software contained within or controlling the control circuit, while other parts are implemented in hardware. For example, blocks 1325 and 1327 may be implemented in software or other medium. The RF input signal enters the linearized power amplifier (block 1320). The linearized power amplifier linearizes and amplifies the RF input signal (block 1321). The linearized and amplified RF signal is directed to the RF output (block 1322). RF output power level is detected and sent to control circuitry (block 1323). The linearizer and power amplifier settings are adjusted (block 1324) based on desired output power level (block 1325) and RF output level (block 1323). Linearizer and power amplifier settings are also adjusted based on output power level (block 1325) and data rate or user desired efficiency level/EVM (block 1327).

Figure 14A:
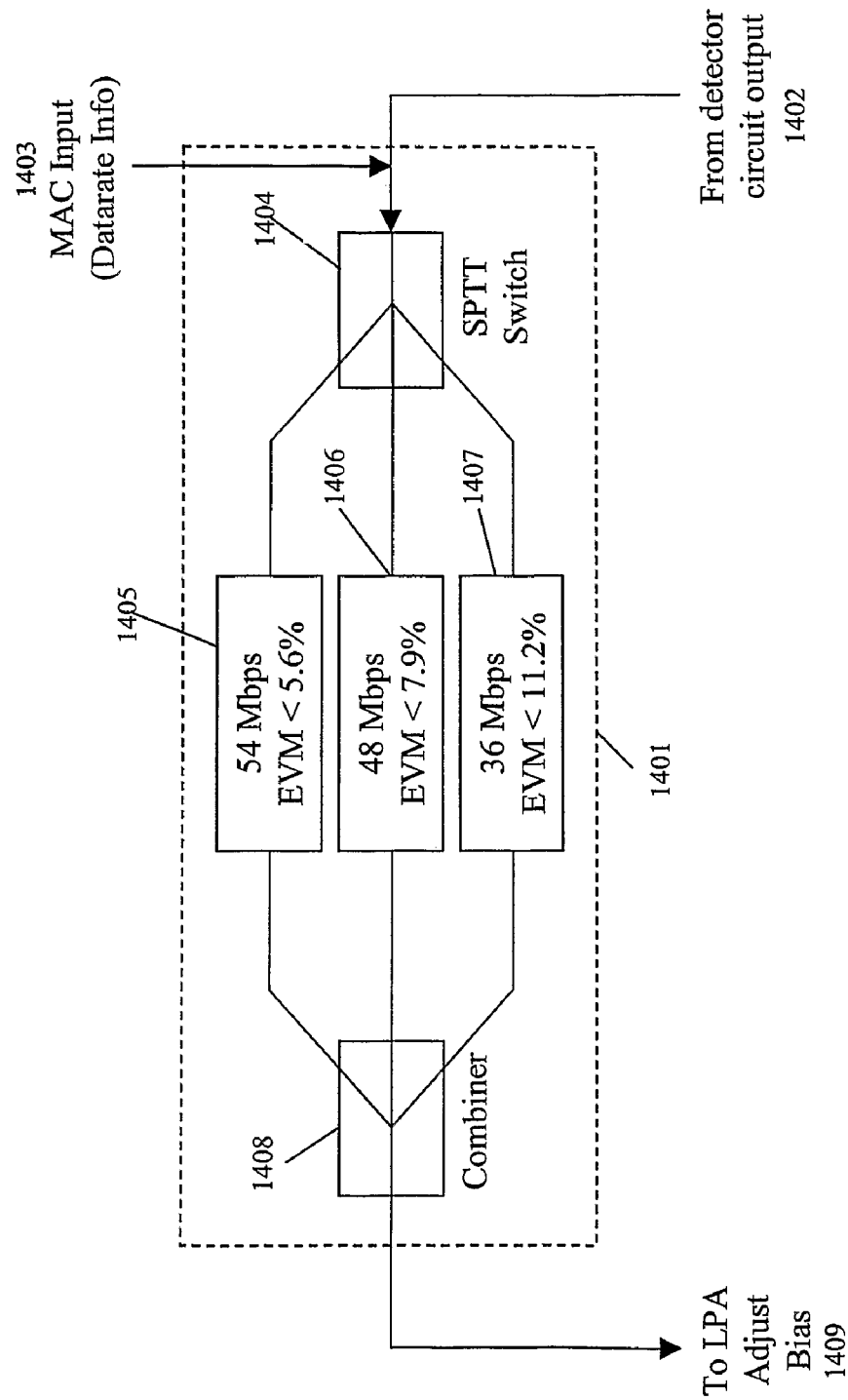
FIG. 14(a) shows a control circuit for adjusting a linearized power amplifier, according to an embodiment of the invention.
Figure 14B:
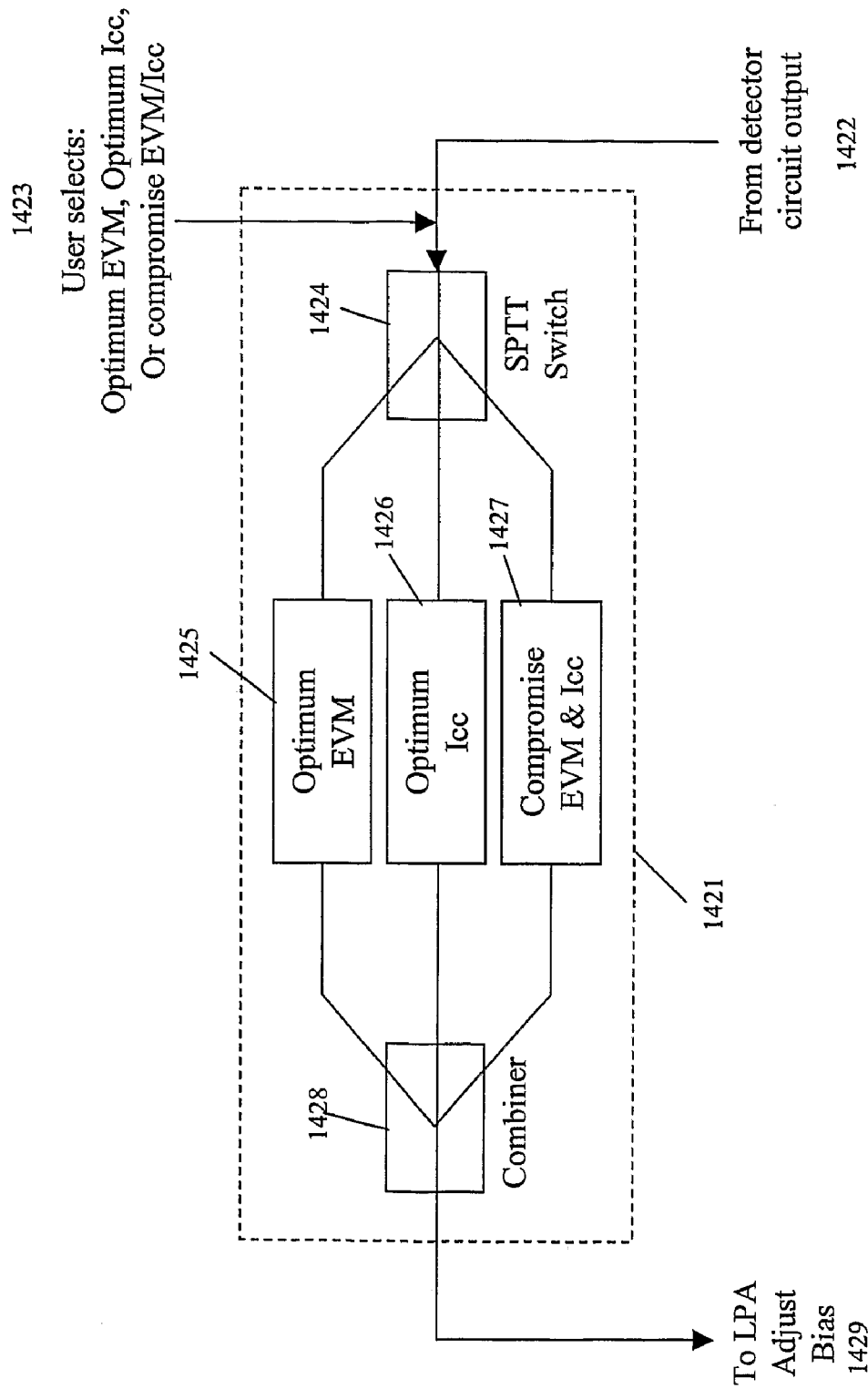
FIG. 14(b) shows a control circuit for adjusting a linearized power amplifier, according to an embodiment of the invention.

FIG. 14(*a*) shows a control circuit for adjusting a linearized power amplifier according to data rate requirement, according to an embodiment of the invention. Such a control circuit may be one such as control circuit for Vc2 1302 from FIG. 13. Shown are control circuit 1401, with MAC input 1403 (with data rate information) and input from the output of detector circuit 1402. MAC input controls the single pole triple throw (SPTT) switch 1404. Also included is a signal to adjust the linearized power amplifier bias 1409. Control circuit 1401 includes single pole triple throw (SPTT) switch 1404, which is coupled to elements 1405, 1406 and 1407. Also included in controller 1401 is combiner 1408. Control circuit 1401 takes MAC input (or data rate information) then adjusts linearized power amplifier bias according to data rate requirement.

Data rate information 1403 is used to control switch 1404 that selects one of three data rate/linearity options for the linearized power amplifier. The 54 Mbps option 1405 biases the linearized power amplifier in a very linear region (significantly backed-off from the power saturation level Psat) necessary to achieve a high data rate. The 36 Mbps option 1407 biases the linearized power amplifier nearer saturation to achieve a higher output power and better efficiency at a cost of worse linearity acceptable by the lower data rate. The 48 Mbps option 1406 biases the linearized power amplifier to achieve an output power level and linearity between the 36 Mbps and the 54 Mbps options. The selected option then passes through combiner 1408, which really represents creating a single output that then is used to adjust the linearized power amplifier bias 1409. Although three data rate options are illustrated here, any number of data rates (e.g., two or more) could be supported using an equivalent scheme. Also note that other variations on this configuration are possible which could accomplish the same effect—for example, the three data rate options could all be active simultaneously, and the MAC data rate information 1403 could be used to control a switch to select the desired bias point.

EVM is an acronym for error vector magnitude, and it represents a measure of the linearity of a signal transmitted by linearized power amplifier. A lower EVM value (in percentage units) represents a more linear signal. To achieve a high data rate such as 54 Mbps, a very tight linearized power amplifier linearity specification (EVM requirement<5.6%) is required in order to maintain signal integrity. A lower data rate such as 36 Mbps can allow a looser EVM specification (<11.2%) and still maintain the signal integrity.

FIG. 14(*b*) shows another control circuit for adjusting a linearized power amplifier according to a user-defined requirement, according to an embodiment of the invention. Shown are control circuit 1421, with inputs 1423 and 1422 and output 1429. Control circuit 1421 takes input of a user selection (optimum linearity or efficiency or compromised linearity and efficiency) and then adjusts linearized power amplifier bias accordingly.

Control circuit 1421 allows the user to select the optimum linearized power amplifier bias point based on the user's environment. According to an embodiment of the invention, the user has the following choices 1) Optimum EVM 1425, which allows the highest data rate, but the efficiency, transmit power and range is low, 2) Optimum Icc 1426, which option allows the user to operate at the highest efficiency (which equates to high output power and long range, but poor linearity and slow data rate), and 3) Compromise EVM and Icc 1427, which allows for a medium range and a medium data rate.

The user controls a single-pole triple throw switch (SPTT) 1424, which selects one of the three options. The selected option then passes through a combiner 1428, which really represents creating a single output point that then is used to adjust the linearized power amplifier bias 1429. Although three options are illustrated here, any number of options (e.g., two or more) could be supported using an equivalent scheme. Also note that other variations on this configuration are possible which could accomplish the same effect.

While the invention has been described with reference to the aforementioned specification, the descriptions and illustrations of the embodiments herein are not meant to be construed in a limiting sense. It shall be understood that the invention is not limited to the specific depictions, configurations or relative proportions set forth herein which depend upon a variety of conditions and variables. Various modifications in form and detail of the embodiments of the invention, as well as other variations of the invention may be made upon reference to the present disclosure.

What is claimed is:

1. A power amplifier subsystem, comprising:
a first stage amplifier and a second stage amplifier, the first and second stage amplifiers each having an input;
a first bias circuit coupled to the input of the first stage amplifier, the first bias circuit including:
a first transistor having an emitter and collector,
a second transistor having an emitter and collector, and
a plurality of resistors,
and wherein the emitter of the second transistor is coupled to a resistor to ground, the base of the second transistor and the emitter of the first transistor are coupled together and coupled to a resistor to ground, and to the input of the first stage amplifier through a resistor; and
a second bias circuit coupled to the second stage amplifier;
wherein the collector of the first transistor is coupled to a bias control voltage.

2. The power amplifier of claim 1, wherein the first transistor comprises a silicon bipolar junction transistor (BJT).

3. The power amplifier of claim 1, wherein the first transistor comprises a gallium arsenide (GaAs) heterojunction bipolar transistor (HBT).

4. The power amplifier of claim 1, wherein the first transistor comprises a silicon germanium (SiGe) heterojunction bipolar transistor (HBT).

5. A power amplifier subsystem, comprising:
a first stage amplifier and a second stage amplifier, the first and second stage amplifiers each having an input;
a first bias circuit coupled to the input of the first stage amplifier, the first bias circuit including:
a first transistor having an emitter and collector,
a second transistor having an emitter and collector, and
a plurality of resistors,
and wherein the emitter of the second transistor is coupled to a resistor to ground, the base of the second transistor and the emitter of the first transistor are coupled together and coupled to a resistor to ground, and to the input of the first stage amplifier through a resistor; and
a second bias circuit coupled to the second stage amplifier;
wherein the second bias circuit includes:
a first transistor having an emitter and collector,
a second transistor having an emitter and collector, and
a plurality of resistors,
and wherein the emitter of the second transistor of the second bias circuit is coupled to a resistor to ground, the base of the second transistor of the second bias circuit and the emitter of the first transistor of the second bias circuit are coupled together and coupled to a resistor to ground, and to the input of the second stage amplifier through a resistor.

6. The power amplifier of claim 1 having a first and second control voltage, wherein the first control voltage is approximately 2.6V and the second control voltage is approximately 3.0V.

7. A single monolithic power amplifier subsystem, comprising:
a substrate, and, in a single monolithic microwave integrated circuit (MMIC) chip,
a first stage amplifier and a second stage amplifier, the first and second stage amplifiers each having an input;
a first bias circuit coupled to the input of the first stage amplifier, the first bias circuit including:
a first transistor having an emitter and collector,
a second transistor having an emitter and collector, and
a plurality of resistors,
and wherein the emitter of the second transistor is coupled to a resistor to ground, the base of the second transistor and the emitter of the first transistor are coupled together and coupled to a resistor to ground, and to the input of the first stage amplifier through a resistor; and
a second bias circuit coupled to the second stage amplifier;
wherein the collector of the first transistor is coupled to a bias control voltage, and the collector of the first transistor is connected to a fixed voltage supply.

8. The single monolithic power amplifier of claim 7, wherein the first transistor comprises a heterojunction bipolar transistor (HBT).

9. A single monolithic power amplifier subsystem, comprising:
a substrate, and, in a single monolithic microwave integrated circuit (MMIC) chip,
a first stage amplifier and a second stage amplifier, the first and second stage amplifiers each having an input;
a first bias circuit coupled to the input of the first stage amplifier, the first bias circuit including:
a first transistor having an emitter and collector,
a second transistor having an emitter and collector, and
a plurality of resistors,
and wherein the emitter of the second transistor is coupled to a resistor to ground, the base of the second transistor and the emitter of the first transistor are coupled together and coupled to a resistor to ground, and to the input of the first stage amplifier through a resistor; and
a second bias circuit coupled to the second stage amplifier;
wherein the second bias circuit includes:
a first transistor having an emitter and collector,
a second transistor having an emitter and collector, and
a plurality of resistors,
and wherein the emitter of the second transistor of the second bias circuit is coupled to a resistor to ground, the base of the second transistor of the second bias circuit and the emitter of the first transistor of the second bias circuit are coupled together and coupled to a resistor to ground, and to the input of the second stage amplifier through a resistor.

* * * * *